US009778571B2

United States Patent
Sasa et al.

(10) Patent No.: US 9,778,571 B2
(45) Date of Patent: Oct. 3, 2017

(54) PROCESSING LIQUID SUPPLYING APPARATUS, PROCESSING LIQUID SUPPLYING METHOD AND STORAGE MEDIUM

(71) Applicant: TOKYO ELECTRON LIMITED, Tokyo (JP)

(72) Inventors: Takashi Sasa, Koshi (JP); Daisuke Ishimaru, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 315 days.

(21) Appl. No.: 14/548,719

(22) Filed: Nov. 20, 2014

(65) Prior Publication Data

US 2015/0140485 A1    May 21, 2015

(30) Foreign Application Priority Data

Nov. 20, 2013    (JP) ................................. 2013-240063

(51) Int. Cl.
| | | |
|---|---|---|
| H01L 21/67 | (2006.01) | |
| G03F 7/16 | (2006.01) | |
| G03F 7/30 | (2006.01) | |

(52) U.S. Cl.
CPC ............ G03F 7/162 (2013.01); G03F 7/3021 (2013.01); H01L 21/6715 (2013.01); H01L 21/67017 (2013.01)

(58) Field of Classification Search
CPC .... H01L 21/027; H01L 21/67017; B67D 7/08
(Continued)

(56) References Cited

U.S. PATENT DOCUMENTS

| | | | | |
|---|---|---|---|---|
| 6,015,066 A | * | 1/2000 | Kimura | ..................... G03F 7/30 137/208 |
| 7,007,822 B2 | | 3/2006 | Forshey et al. | |

(Continued)

FOREIGN PATENT DOCUMENTS

| | | |
|---|---|---|
| JP | H09-260332 A | 10/1997 |
| JP | H10-189433 A | 7/1998 |

(Continued)

OTHER PUBLICATIONS

Japanese Office Action, Japanese Application No. 2013-240063, dated Feb. 23, 2016 (5 pages).

*Primary Examiner* — Cachet Sellman
(74) *Attorney, Agent, or Firm* — Burr & Brown, PLLC

(57) ABSTRACT

A processing liquid supplying apparatus supplies a processing liquid to a process object via a discharging part. In one embodiment, the apparatus includes: a processing liquid source that supplies a processing liquid; an intermediate tank connected to the processing liquid source via a transport line; a feed line provided between the intermediate tank and the discharging part; an evacuating unit that evacuates an interior of the intermediate tank to transport the processing liquid from the processing liquid source to the intermediate tank through the transport line; and a pressure adjusting unit that supplies a gas into the intermediate tank to return a pressure in the evacuated intermediate tank from a reduced pressure to a normal pressure, thereby to place the intermediate tank ready for feeding the processing liquid, having been transported into the intermediate tank, into the feed line.

12 Claims, 14 Drawing Sheets

(58) Field of Classification Search
USPC ............... 222/64, 61, 52; 137/208, 205, 209
See application file for complete search history.

(56) References Cited

U.S. PATENT DOCUMENTS

| | | | |
|---|---|---|---|
| 2003/0010792 A1* | 1/2003 | Forshey | B01F 15/0266 |
| | | | 222/56 |
| 2003/0012709 A1* | 1/2003 | Xu | B08B 9/032 |
| | | | 222/190 |
| 2010/0058985 A1* | 3/2010 | Kim | G03F 7/16 |
| | | | 118/720 |

FOREIGN PATENT DOCUMENTS

| | | |
|---|---|---|
| JP | 2000-114153 A | 4/2000 |
| JP | 2005-527814 A | 9/2005 |
| JP | 2008-006325 A1 | 1/2008 |
| JP | 2010-067978 A | 3/2010 |
| WO | 03/093118 A1 | 11/2003 |

* cited by examiner

PROCESSING LIQUID SUPPLYING APPARATUS, PROCESSING LIQUID SUPPLYING METHOD AND STORAGE MEDIUM

CROSS-REFERENCE TO RELATED APPLICATIONS

This application is based upon and claims the benefit of priority from Japanese patent application No. 2013-240063 filed on Nov. 20, 2013, the entire contents of which are incorporated herein by reference.

BACKGROUND OF INVENTION

Field of the Invention

The present invention relates to a technique for transporting a processing liquid to be supplied to a process object.

Description of Related Art

Semiconductor manufacturing processes include a photolithography process that applies a resist in a form of a film onto a semiconductor wafer (hereinafter referred to as "wafer") as a process object, and exposes the resist film with a predetermined pattern, and develops the resist film to form a resist pattern.

Various processing liquids, such as a resist liquid for forming a resist film and a developer, are used in the photolithography process. For example, as described in JP2008-006325A (see Paragraphs 0044 and 0048 and FIG. 4). These processing liquids are stored in individual containers (processing liquid sources). The interior of the container is pressurized with a gas to push out the processing liquid therefrom to transport the processing liquid toward a nozzle (discharging part) for supplying the processing liquid to a wafer.

In a case where a pressurized gas is used for driving a processing liquid, the gas is dissolved in the processing liquid and might be released from the processing liquid to generate bubbles in the processing liquid due to pressure fluctuation during transportation of the liquid. The supply of such a processing liquid containing bubbles results in non-uniform coating and/or generation of defects in a film.

SUMMARY OF THE INVENTION

The object of the present invention is to provide a technique that is capable of transporting a processing liquid under the condition where bubbles are hardly generated.

In one embodiment of the present invention, there is provided a processing liquid supplying apparatus that supplies a processing liquid to a process object via a discharging part, the apparatus including: a processing liquid source that supplies a processing liquid; an intermediate tank connected to the processing liquid source via a transport line; a feed line provided between the intermediate tank and the discharging part; an evacuating unit that evacuates an interior of the intermediate tank to transport the processing liquid from the processing liquid source to the intermediate tank through the transport line; and a pressure adjusting unit that supplies a gas into the intermediate tank to return a pressure in the evacuated intermediate tank from a reduced pressure to a normal pressure, thereby to place the intermediate tank ready for feeding the processing liquid, having been transported into the intermediate tank, into the feed line.

The processing liquid supplying apparatus may have at least one of the following features:

(a) The processing liquid source includes a pressurizing unit that pressurizes the processing liquid in the processing liquid source, thereby to fill an area downstream of the feed line with the processing liquid through the transport line and the intermediate tank.

(b) A plurality of intermediate tanks are connected to the processing liquid source in parallel, and the processing liquid supplying apparatus further includes: a flow-combining unit, disposed between the plurality of intermediate tanks and the evacuating unit, at which gases evacuated from the intermediate tanks merge with each other; a pressure sensor that detects a pressure in the flow-combining unit; and a control unit configured to perform a step of setting a target pressure in the flow-combining unit, as a function of the number of the intermediate tank to which the processing liquid is transported, the target pressure causing the processing liquid to flow from the processing liquid source to each of the intermediate tanks at a predetermined flow rate, and a step of controlling an evacuating rate of the evacuating unit such that the pressure in the flow-combining unit detected by the pressure sensor becomes the predetermined target pressure.

(c) In the case of (b), the processing liquid supplying apparatus further includes a flow rate-determining unit that determines a flow rate of the processing liquid transported from the processing liquid source to each of the intermediate tanks, wherein the control unit is configured to perform the setting of the target pressure using a regression equation expressing a relationship between the pressure in the flow-combining unit and a sum of flow rates of the processing liquid transported from the processing liquid source to the respective intermediate tanks, and configured, if a difference between the sum of the flow rates of the processing liquid determined by the flow rate-determining unit and the sum of flow rates calculated by applying the target pressure to the regression equation is out of a predetermined allowable range when the processing liquid is transported to the respective intermediate tanks with the pressure in the flow-combining unit being set at the target pressure, to generate a new regression equation based on an actual value of the pressure in the flow-combining unit detected by the pressure sensor and actual values of the flow rates determined by the flow rate-determining unit, and configured to set the target value using the new regression equation.

(d) In the case of (b) and (c), the flow rate-determining unit includes a lower liquid level sensor and a higher liquid level sensor disposed at different height levels of each of the intermediate tanks, a time measurement unit that measures a time period from a time point when the liquid level is detected by the lower liquid level sensor to a time point when the liquid level is detected by the higher liquid level sensor, and the flow rate-determining unit is configured to determine the flow rate of the processing liquid based on a volume of a part of the intermediate tank between the lower and higher liquid level sensors and a time period measured by the time measurement unit.

(e) The gas supplied from the pressure adjusting unit into the intermediate tank is an inert gas. In addition, the pressure adjusting unit has a filter for removing particles from the gas supplied to the intermediate tank.

In another embodiment, there is provided a processing liquid supplying method for supplying a processing liquid to a process object via a discharging part, the method including: evacuating an interior of an intermediate tank which is connected to a processing liquid source that supplies the processing liquid via a transport line, thereby transporting the processing liquid to the intermediate tank; supplying a gas for adjusting a pressure into the intermediate tank, having been evacuated, to return pressure in the intermediate tank from a reduced pressure to a normal pressure; and feeding the processing liquid, having been supplied into the intermediate tank, into a feed line provided between the intermediate tank and the discharging part.

In yet another embodiment, there is provided a non-transitory storage medium storing a computer program upon execution of which a processing liquid supplying apparatus performs the foregoing processing liquid supplying method.

According to the foregoing embodiments, since the processing liquid is transported from the processing liquid source to the intermediate tank by evacuating the interior of the intermediate tank, dissolving of a gas into the processing liquid during the transportation of the processing liquid can be restrained, whereby generation of bubbles in the processing liquid can be prevented. In addition, since the processing liquid is supplied to a process object through the intermediate tank, the process object can be processed even under the situation where the processing liquid cannot be fed from the processing liquid source, e.g., during the replacement of a processing liquid container or the like.

DETAILED DESCRIPTION OF THE INVENTION

An embodiment of the present invention will be explained herebelow with reference to the attached drawings. Herein, the explanation is made for a case where a processing liquid supplying apparatus in one embodiment of the present invention is incorporated into a coating and developing apparatus.

Figure 1:
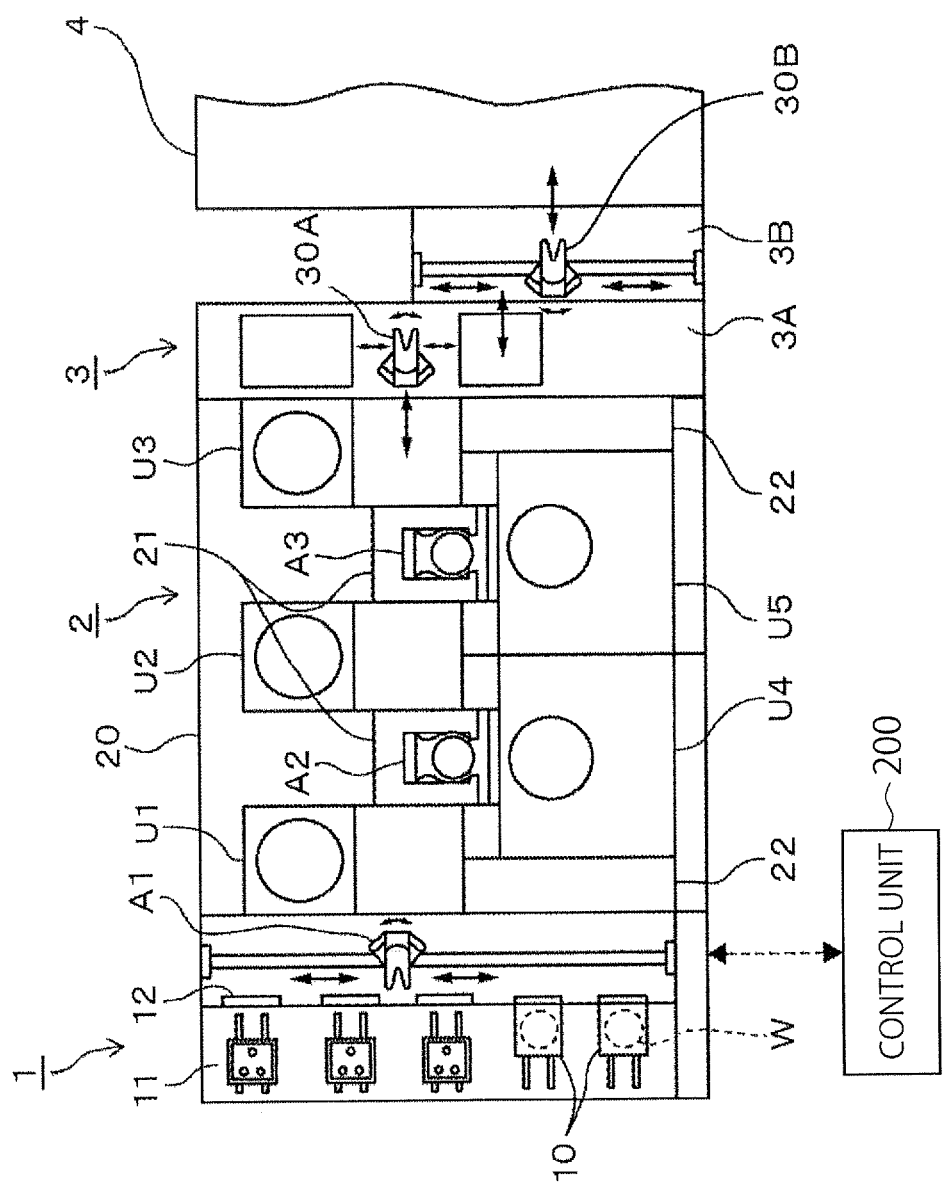
FIG. 1 is a transversely-sectioned plan view of a coating and developing apparatus.
Figure 2:
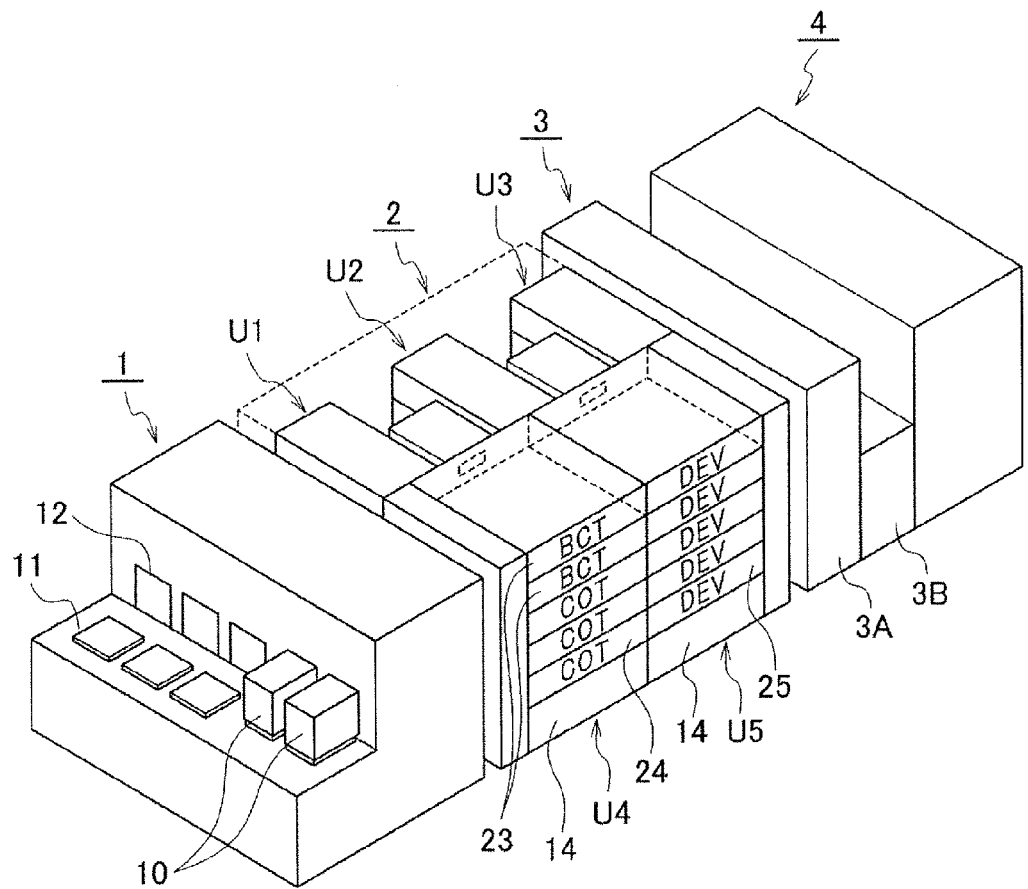
FIG. 2 is a perspective view of the coating and developing apparatus.

As shown in FIGS. 1 and 2, the coating and developing apparatus includes: a carrier station 1 to and from which a carrier 10, which contains a plurality of wafers, e.g., twenty five wafers W as process objects, is loaded and unloaded; a processing section 2 that preforms processes such as a resist coating process and a developing process to the wafer W removed from the carrier station 1; and an interface section 3 that transfers the wafer W between the processing section 2 and an exposure section 4 for performing an immersion exposure by which the surface of the wafer W is exposed with a light-transmitting liquid layer being formed on the surface of the wafer W.

The carrier station 1 is provided with: a table 11 on which a plurality of carriers 10 can be placed thereon in a row; an opening and closing part 12 formed in a wall in front of the table 11; and a transfer mechanism A1 that removes a wafer W form the carrier 10 via the opening and closing part 12.

The interface section 3 has a first transfer chamber 3A and a second transfer chamber 3B that are arranged in a back and forth direction between the processing section 2 and the exposure section 4. The first transfer chamber 3A is provided therein with a first wafer transport unit 30A. The second transfer chamber 3B is provided therein with a second wafer transport unit 30B.

The processing section 2 surrounded by a housing 20 is arranged behind and connected to the carrier section 1. The processing section 2 is provided therein with: shelf units U1, U2 and U3 each of which is formed by stacking heating/cooling units; liquid processing units U4 and U5; and main transfer mechanisms A2 and A3 for transferring a wafer W among respective units. The main transfer mechanisms A2 and A3 are disposed in a space surrounded by a partition 21, which comprise a wall on the side of the shelf units U1, U2 and U3, a wall on the side of the liquid processing units U4 and U5, and front and back walls. A temperature/humidity control unit 22 including process liquid temperature control units each for controlling the temperature of the process liquid used in the respective processing units, and temperature/humidity regulating ducts each for controlling the temperature/humidity in the respective processing unit are provided in a space between the carrier station 1 and the processing section 2 and a space between the processing section 2 and the interface section 3.

Each of the shelf units U1, U2 and U3 is formed by stacking, at a plurality of (e.g., ten) levels, various units for performing pre-processes (pre-treatments) and post-processes (post-treatment) of a process (treatment) performed by the liquid processing units U4 and U5. The combination of the units in the shelf units U1, U2 and U3 may include a heating unit (not shown) for heating (backing) a wafer W, a cooling unit (not shown) for cooling a wafer W and so on. Each of the liquid processing units U4 and U5 is configured to supply a processing liquid to a wafer W to perform a liquid treatment to the wafer W. As shown in FIG. 2, each of the liquid processing units U4 and U5 is formed by stacking, at a plurality of (e.g., five) levels, on a chemical liquid containing part 14 for containing a resist and a developer, an antireflection film coating unit (BCT) 23 for applying an antireflection film, a coating unit (COT) 24 for applying a resist liquid to a wafer W, a developing unit (DEV) 25 for developing a wafer W by supplying thereto a developer. The processing liquid supplying apparatus is incorporated into each of the units 23, 24 and 25.

An example of a flow of a wafer W in the foregoing coating and developing apparatus is briefly explained with reference to FIGS. 1 and 2. In the coating and developing apparatus, wafers W belonging to the same production lot are successively transferred. Firstly, when the carrier 10 accommodating, e.g., twenty five, wafers W is placed on the table 11, the opening and closing part 12 opens a lid of the carrier 10. Then, each wafer W is removed from the carrier 10 by the transfer mechanisms A1.

The wafer W thus removed is transferred to the main transfer mechanism A2 via a transition unit (not shown) included in the shelf unit U1. The wafer W is subjected to, for example, an antireflection film forming process and a cooling process, which are pre-processes for the coating process. Then, the wafer W is coated with a resist liquid by the coating unit (COT) 24. Thereafter, the wafer W is transferred by the main transfer mechanism A2 to the heating unit included in the shelf units U1 to U3 in which the wafer W is heated (baked). After that, the wafer W is cooled, and is then loaded into the interface section 3 through the transition unit included in the shelf unit U3.

From the interface section 3, the wafer W is transferred to the exposure section 4 by the first wafer transfer unit 30A in the first transfer chamber 3A and the second wafer transfer unit 30B in the second transfer chamber 3B. In the exposure section 4, the wafer W is exposed by an exposure device (not shown) which is disposed to face the surface of the wafer W. After exposed, the wafer W is transferred to the main transfer mechanism A2 along a route reverse to the route along which the wafer W is transported to the exposure section 4, and is transferred to the developing unit (DEV) 25, in which the wafer W is developed so that the resist pattern is formed on the wafer W. Thereafter, the wafer W having the resist pattern is returned to the original carrier 10 placed on the table 11.

Figure 3:
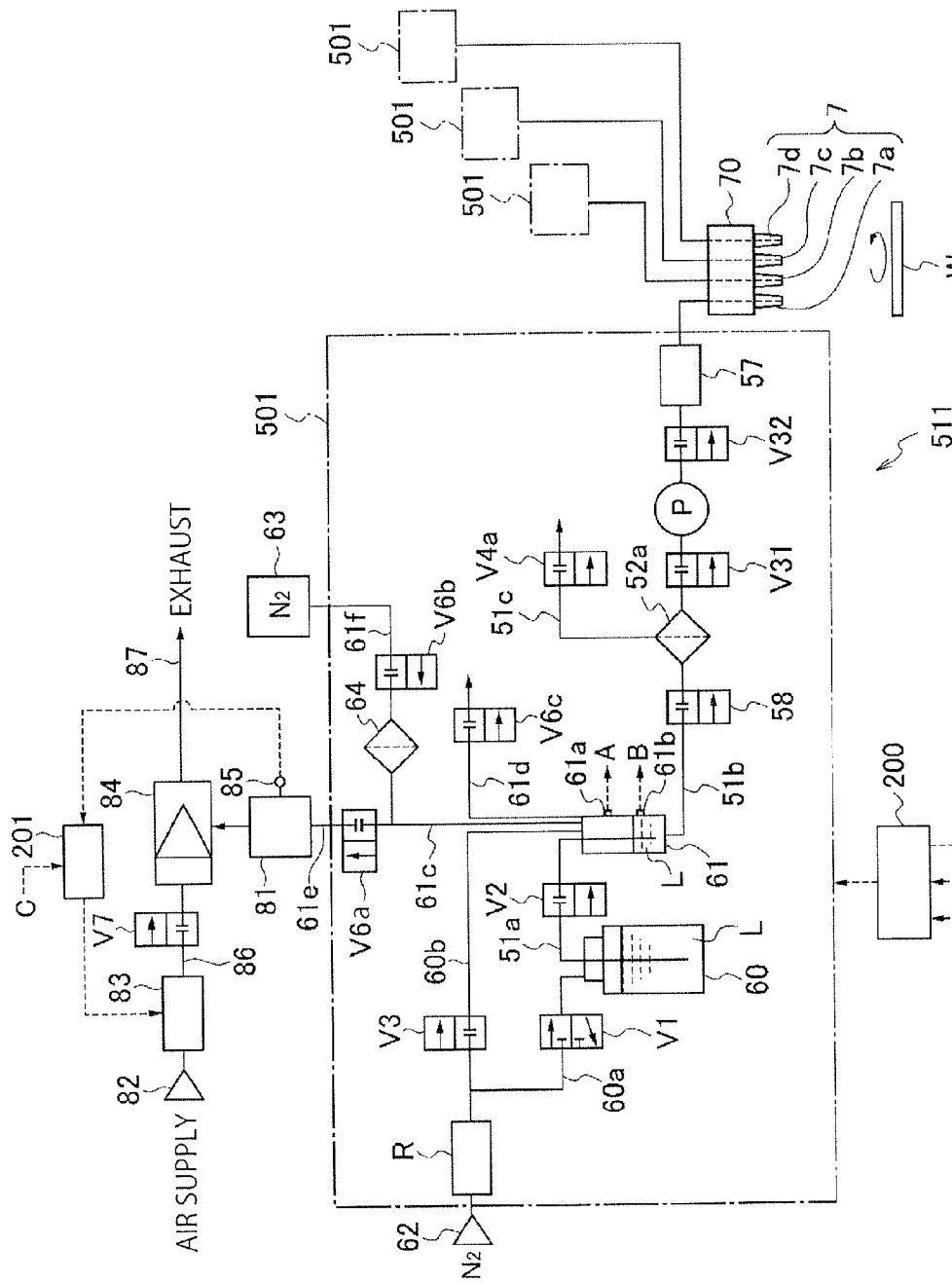
FIG. 3 is a piping diagram showing a first configuration of a processing liquid supplying apparatus in one embodiment of the present invention incorporated into the coating and developing apparatus.

Next, the structure of the processing liquid supplying apparatus incorporated into the units 23, 24 and 25 in the liquid processing units U4 and U5 is described with reference to FIG. 3. FIG. 3 shows a processing liquid supplying apparatus 511 for supplying a resist liquid (which is a processing liquid) to a nozzle unit 70 of the coating unit (COT) 24. The processing liquid supplying apparatus 511 includes a resist liquid supplying unit 501. The resist liquid supplying unit 501 is includes: a resist container 60 serving as a source of a resist liquid L (processing liquid source); a reservoir tank 61 (intermediate tank) that temporarily stores the resist liquid L transported from the resist container 60; a first processing liquid supply pipe 51a (transport line) connecting the resist container 60 to the reservoir tank 61; and a second processing liquid supplying pipe 51b (feed line) that feeds the resist liquid L from the reservoir tank 61.

The resist container 60 is a replaceable container that can be installed from outside of the processing liquid supplying apparatus. A first gas supplying pipe 60a is connected to the resist container 60 to supply an inert gas, such as nitrogen (N₂) gas, toward a gas phase region (i.e., a region not to be filled with the resist liquid L) in an upper part of the container, so as to pressurize the resist liquid L and discharge the resist liquid L from the container 60. The first gas supplying pipe 60a is connected to an N₂ gas source 62 through an electromagnetic switching valve V1 and an electro-pneumatic regulator R for controlling the N₂ gas pressure. The N₂ gas source 62, the first gas supplying pipe 60a and the electro-pneumatic regulator R constitute a pressurizing unit that fills an area downstream of the reservoir tank 61 with the resist liquid L.

The proximal end of the first processing liquid supplying pipe 51a, connecting the resist container 60 to the reservoir tank 61, is inserted into the resist container 60 to position close to the bottom surface of the resist container 60, so that the resist liquid L in the resist container 60 can be transported without any loss. The distal end of the first processing liquid supplying pipe 51a is inserted into the reservoir tank 61 such that the distal end opening thereof is opened into the interior of the reservoir tank 61 at a level lower than a low level sensor 61b (described below). Since the resist liquid L is discharged from the first processing liquid supplying pipe 51a directly into the resist liquid L stored in the reservoir tank 61, dissolving of a gas into the resist liquid L can be restrained, as compared with the case where the resist liquid L falls onto the liquid surface of the resist liquid L stored in the reservoir tank 61. The first processing liquid supplying pipe 51a between the resist container 60 and the reservoir tank 61 is provided with an electromagnetic switching valve V2.

The reservoir tank 61 is a fixed constituent element of the resist liquid supplying unit 501, which temporarily stores the resist liquid L transported from the replaceable resist container 60, and from which the resist liquid L is fed toward a wafer W. A high level sensor 61a and a low level sensor 61b are disposed on a sidewall of the reservoir tank 61. The high level sensor 61a detects that a liquid level of the resist liquid L stored in the reservoir tank 61 reaches an upper limit level. The low level sensor 61b detects that the liquid level of the resist liquid L stored in the reservoir tank 61 reaches a lower limit level, which notifies that replenishment of the resist liquid L is needed. In the illustrated embodiment, when the liquid level of the resist liquid L becomes higher than the sensor 61a (61b), the sensor 61a (61b) is turned into "ON" state, outputting a detection signal to an overall control unit 200 (described later). On the other hand, when the liquid level of the resist liquid L becomes lower than the sensor 61a (61b), the sensor 61a (61b) is turned into "OFF" state, stopping the output of the detection signal.

A drain pipe 61d, which is used when the resist liquid L in the reservoir tank 61 is drained therefrom, is connected to an upper part of the reservoir tank 61. The drain pipe 61d is provided thereon with an electromagnetic switching valve V6c. A second gas supplying pipe 60b is connected to an upper surface of the reservoir tank 61. The second gas supplying pipe 60b is provided thereon with an electromagnetic switching lave V3. The second gas supplying pipe 60b receives N₂ gas for pressurization, which is supplied from the N₂ gas source 62.

The proximal end of the second processing liquid supplying pipe 51b is connected to a bottom surface of the reservoir tank 61 to discharge the processing liquid L in the reservoir tank 61. The second processing liquid supplying pipe 51b is connected to a nozzle 7 (7a) through a filter 52a, a feed pump P and a supply control valve 57. The nozzle 7 serving as a discharging part of the resist liquid L is held on a nozzle unit 70. On the second processing liquid supplying pipe 51b, an electromagnetic switching valve 58 is disposed between the reservoir tank 61 and the filter 52a; an electro-magnetic switching valve V31 is disposed between the filter 52a and the feed pump P; and an electromagnetic switching valve V32 is disposed between the feed pump P and the supply control valve 57.

The filter 52a filters the resist liquid L to be supplied to a wafer W so as to remove foreign matters such as bubbles and particles contained in the resist liquid L. A vent pipe 51c is connected to an upper part of the filter 52a to venting a gas remaining in the filter 52a. The vent pipe 51c is provided thereon with an electromagnetic switching valve V4a.

The feed pump P may be a diaphragm pump or a tube pump suitable for transporting a liquid. The feed pump P transports the resist liquid L from the reservoir tank 61 to the nozzle 7. The supply control valve 57 may be a flow-rate control valve having a dispensing valve.

The nozzle unit 70 holds a plurality of nozzles 7 (four nozzles 7 are illustrated in the drawings). The respective nozzles 7 (7a to 7d) are connected to the individual resist liquid supplying units 501. The resist liquids L of different types or different concentrations are supplied from the resist liquid supplying units 501 connected to the respective nozzles 7a to 7d. The resist liquid supplying units 501 has the same structure, only one of which is illustrated in detail in FIG. 3.

The aforementioned processing liquid supplying apparatus 511 transports the resist liquid L using a suctioning force as a driving force, which is generated by evacuating the interior of the reservoir tank 61, so that dissolving of a gas into the resist liquid L is suppressed. This advantageous function is explained in detail below.

A supply/exhaust pipe 61c is connected to the upper surface of the reservoir tank 61. The supply/exhaust pipe 61c divided into a tank exhaust pipe 61e for evacuating a space (gas phase portion) above the resist liquid L in the reservoir tank 61, and a pressure-adjusting-gas supplying pipe 61f for receiving an inert gas for returning the pressure in the reservoir tank 61 from a reduced pressure to an atmospheric pressure (normal pressure), after the transportation of the resist liquid L has been finished.

The tank exhaust pipe 61e is connected to an ejector 84 though an electromagnetic switching valve V6a and a trap tank 81 for trapping a liquid such as a mist scattered from the reservoir tank 61. A gas (e.g., air), which is fed from a feed unit 82 through a feed pipe 86, is discharged from a nozzle 87 of the ejector 84, so that a fluid in the tank exhaust pipe 61e is merged with and drawn by the discharging gas and whereby the interior of the reservoir tank 61 is evacuated by the ejector 84. Provided on the feed pipe 86 are an electro-pneumatic regulator 83 for regulating a supply rate of a gas to the ejector 84, and an electromagnetic switching valve V7. In the illustrated embodiment, the ejector 84, the tank exhaust pipe 61e and the feed and exhaust pipe 61c constitute an evacuating unit.

The pressure-adjusting-gas supplying pipe 61f is connected to a pressure-adjusting-gas supplying unit 63 through a filter 64 and an electromagnetic switching valve V6b. An inert gas (e.g., $N_2$ gas in this embodiment) as a pressure-adjusting gas is supplied from the pressure-adjusting-gas supplying unit 63 into the reservoir tank 61 having been evacuated, so that the pressure in the reservoir tank 61 is returned from a reduced pressure to an atmospheric pressure. In this embodiment, the pressure-adjusting-gas supplying unit 63, the pressure-adjusting-gas supplying pipe 61f and the feed and exhaust pipe 61c constitute a pressure adjusting unit.

The basic structures of the resist liquid supplying unit 501 and the ejector 84 for evacuating the reservoir tank 61 have been described above with reference to FIG. 3. Meanwhile, as previously described with reference to FIG. 2, the coating and developing apparatus in this embodiment includes the three coating units 24. If the resist liquid L is supplied from a single common resist container 60, the processing liquid supplying apparatus 511 should be configured to supply the resist liquid L to all the coating units 24.

Figure 4:
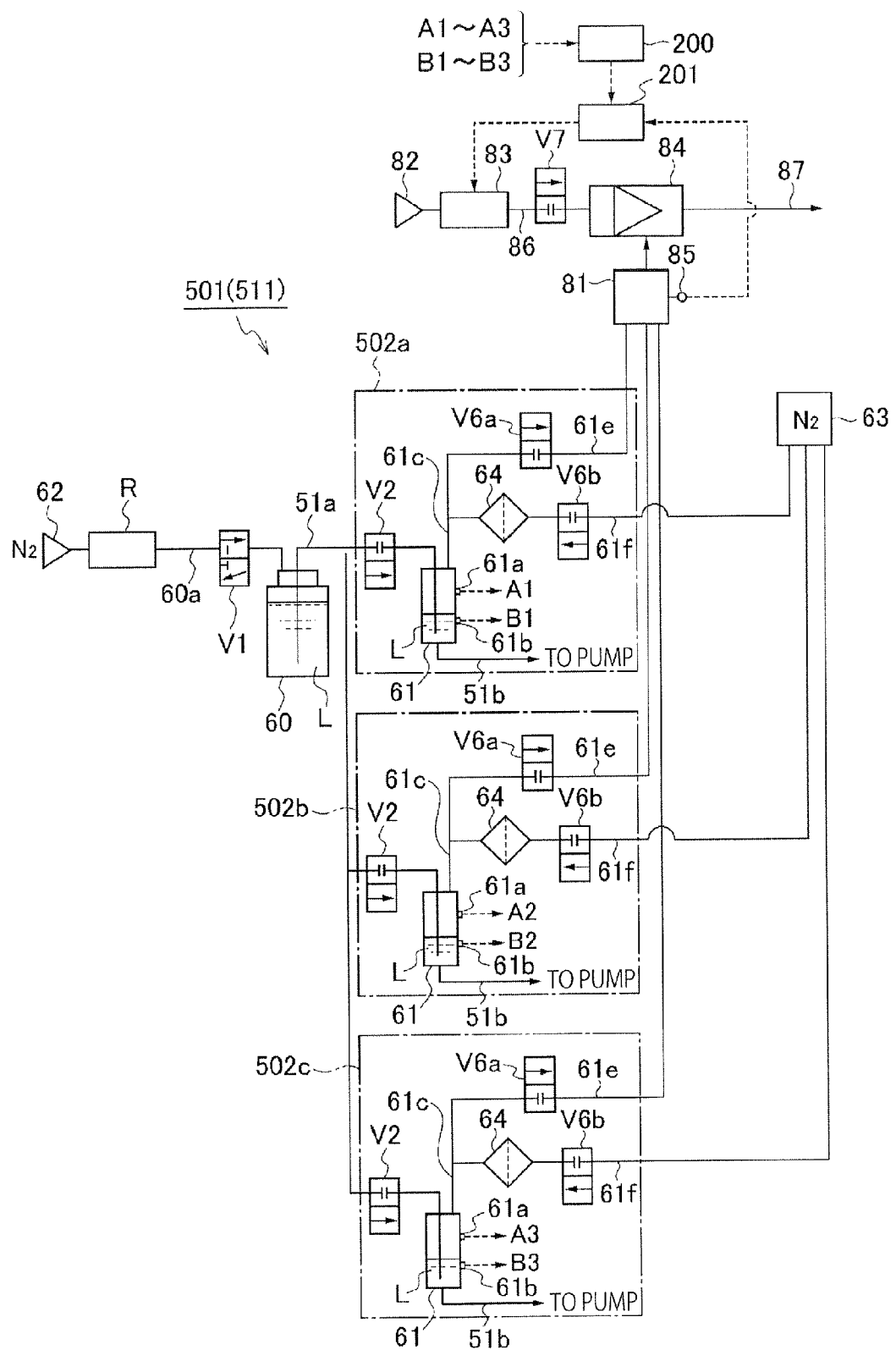
FIG. 4 is a piping diagram showing a second configuration of a processing liquid supplying apparatus.

In the processing liquid supplying apparatus 511 in this embodiment, as shown in FIG. 4, the resist liquid supplying unit 501 may have a plurality of the reservoir tanks 61 that are connected in parallel to the common resist container 60, so that the resist liquid L can be supplied to the plurality of coating units 24 through the respective reservoir tanks 61. FIG. 4 shows a variation where the processing liquid supplying apparatus 511 has three subsystems, i.e., a first subsystem 502a, a second subsystem 502b and a third subsystem 502c. Each of the subsystems 502a to 502c is equipped with the reservoir tank 61 and the foregoing pipes (i.e., first processing liquid supplying pipe 51a, second processing liquid supplying pipe 51b, feed and exhaust pipe 61c, tank exhaust pipe 61e and pressure-adjusting-gas supplying pipe 61f). In FIG. 4, the filter 52a and the feed pump P on the second processing liquid supplying pipe 51b, and the drain pipe 61d and the like, which are actually provided in each of the subsystems 502a to 502c are not shown in FIG. 4, for simplicity of the drawing.

As shown in FIG. 4, the tank exhaust pipes 61e, which are used for evacuating the reservoir tanks 61 in the respective subsystems 502a to 502c, are connected to the (common) trap tank 81. The reservoir tanks 61 are evacuated by the (common) ejector 84 through the trap tank 81. In this embodiment, the trap tank 81, in which exhaust gases from the respective reservoir tanks 61 through the tank exhaust pipes 61e merge with each other, constitute a flow-combining unit.

The trap tank 81 is equipped with a manometer 85, which is a pressure sensor that detects the pressure in the trap tank 81, and which outputs the detected pressure in the trap tank 81 to a controller 201. The controller 201 controls the opening degree of the electro-pneumatic regulator 83 to adjust the gas supply rate to the ejector 84 and thus the evacuating rate of the reservoir tank 61 by the ejector 84, so that the pressure in the trap tank 81 detected by the manometer 85 becomes a predetermined target pressure. The reservoir tanks 61 of the respective subsystems 502a to 502c are connected to the common pressure-adjusting-gas supplying unit 63 through the pressure-adjusting-gas supplying pipes 61f, so that the pressure in each of the reservoir tanks 61 can be returned from a reduced pressure to the atmospheric pressure.

FIG. 4 shows the structure of one of the resist liquid supplying units 501 for the supplying of the resist liquid to one of the nozzles 7 (e.g., the nozzle 7a) shown in FIG. 3.

The processing liquid supplying apparatus also includes different resist liquid supplying units 501 for supplying the resist liquid L to another nozzle 7 (e.g., nozzle 7b, 7c or 7d), respectively. These different resist liquid supplying units 501 also includes subsystems 502a to 502c having respective reservoir tanks 61, which are connected in parallel to a common resist container 60; and each of the subsystems 502a to 502c is connected to a common trap tank 81, the common ejector 84, and the common pressure-adjusting-gas supplying unit 63, like the resist liquid supplying unit 501 for the nozzle 7a shown in FIG. 4.

Alternatively one trap tank 81, one ejector 84 and one pressure-adjusting-gas supplying unit 63 may be shared by the subsystems 502a to 502c of all the plurality of the resist liquid supplying units 501; all the subsystems 502a to 502c of all the plurality of the resist liquid supplying units 501 are connected to one trap tank 81, one ejector 84 and one pressure-adjusting-gas supplying unit 63. Alternatively, the processing liquid supplying apparatus may include two or more trap tanks 81, two or more ejectors 84 and two or more pressure-adjusting-gas supplying units 63; one trap tank 81, one ejector 84 and one pressure-adjusting-gas supplying unit 63 may be shared by some of the resist liquid supplying units 501. Alternatively, one trap tank 81, one ejector 84 and one single pressure-adjusting-gas supplying unit 63 may be assigned to each of the resist liquid supplying units 501. In the explanation for the operation mentioned later, the explanation is made for the case where the three subsystems 502a to 502c are connected to the common trap tank 81, the common ejector 84 and the common pressure-adjusting-gas supplying unit 63, as shown in FIG. 4.

As shown in FIG. 1, the coating and developing apparatus is equipped with an overall control unit 200 that controls all the operations of the coating and developing apparatus. As shown in FIG. 3, the overall control unit 200 controls the processing liquid supplying apparatus 511. The overall control unit 200 is comprises a computer including a CPU and a storage unit that stores a program including steps (commands) of the operation of the processing liquid supplying apparatus 51, i.e., the operation for transporting the resist liquid L from the resist container 60 to the reservoir tank 61 so as to supply the resist liquid L to a wafer W through the nozzle 7. The program is stored in a storage medium such as a hard disc, a compact disc, a magnetoptical disc, a memory card or the like, and is installed therefrom to the computer.

In particular, when the resist liquid L is transported to the reservoir tanks 61 of the subsystems 502a to 502c, the overall control unit 200 judges whether or not the resist liquid L should be replenished to each reservoir tank 61, based on output signals of the high level sensor 61a and the low level sensor 61b of each reservoir tank 61. The overall control unit 200 also calculates and changes the target pressure in the trap tank 81 such that a flow rate of the resist liquid L flowing into each reservoir tank 61 becomes a predetermined flow rate, as a function of the number of the reservoir tanks 61 to which the resist liquid L is transported. In this embodiment, the overall control unit 200 and the controller 201 constitute a control unit of the processing liquid supplying apparatus 511.

The operation of the processing liquid supplying apparatus 511 is explained below. Firstly, the operation related to the one resist liquid supplying unit 501 shown in FIG. 3 is described with reference to the flowchart of FIG. 5, the time chart of FIG. 6 and the operational diagrams of FIGS. 7 to 12. In FIG. 6, (a) and (b) show ON/OFF of the outputs of the low level sensor 61b and the high level sensor 61a, (c) to (f) show the open/close of the switching valves V2, V6a, V6b and V7 of the respective pipes 51a, 61e, 61f and 86, (g) shows the opening degree of the electro-pneumatic regulator 83 which is regulated by the controller 201, and (h) shows an indication of the manometer 85 of the trap tank 81.

Figure 7:
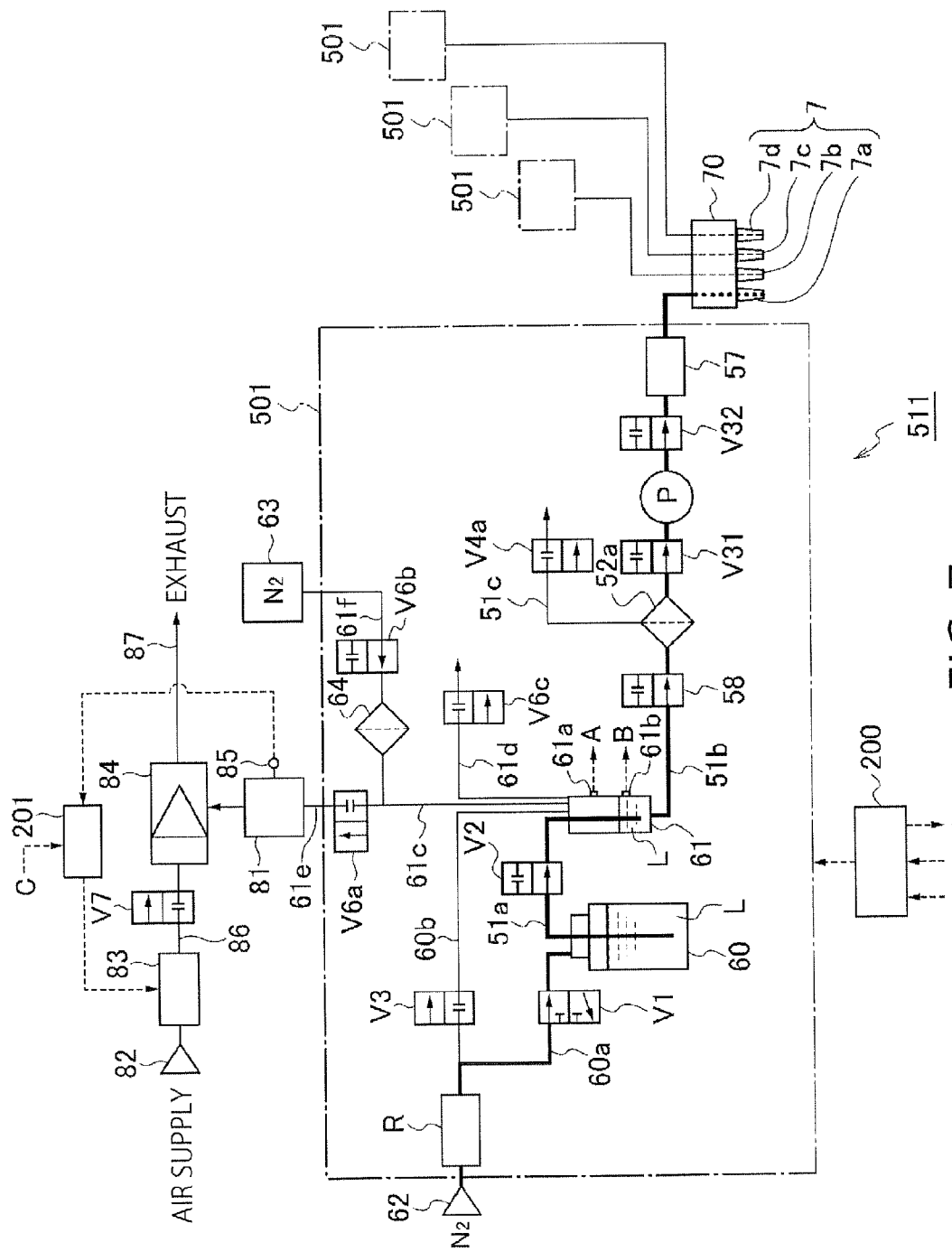
FIG. 7 is a first operation diagram of the processing liquid supplying apparatus.

If the resist container 60 is firstly connected to the resist liquid supplying unit 501, or if the reservoir tank 61 is empty, or if replacement of the filter 52a or opening of the feed pump P has been carried out when the resist container 60, a resist liquid filling operation is performed to fill the resist liquid L into a fluid line including the first processing liquid supplying pipe 51a, the reservoir tank 61, the filter 52a, the feed pump P, the supply control valve 57 and the nozzle 7a, as shown in FIG. 7. In this case, it is impossible to fill the area downstream of the reservoir tank 61 with the resist liquid L, only by evacuating the reservoir tank 61. Thus, $N_2$ gas for pressurization is also supplied to the resist container 60 from the $N_2$ gas source through the first gas supplying pipe 60a, so that the resist liquid L is pushed out from the resist container 60 toward the area downstream of the resist container 60 to fill the fluid line with the resist liquid L.

Figure 8:
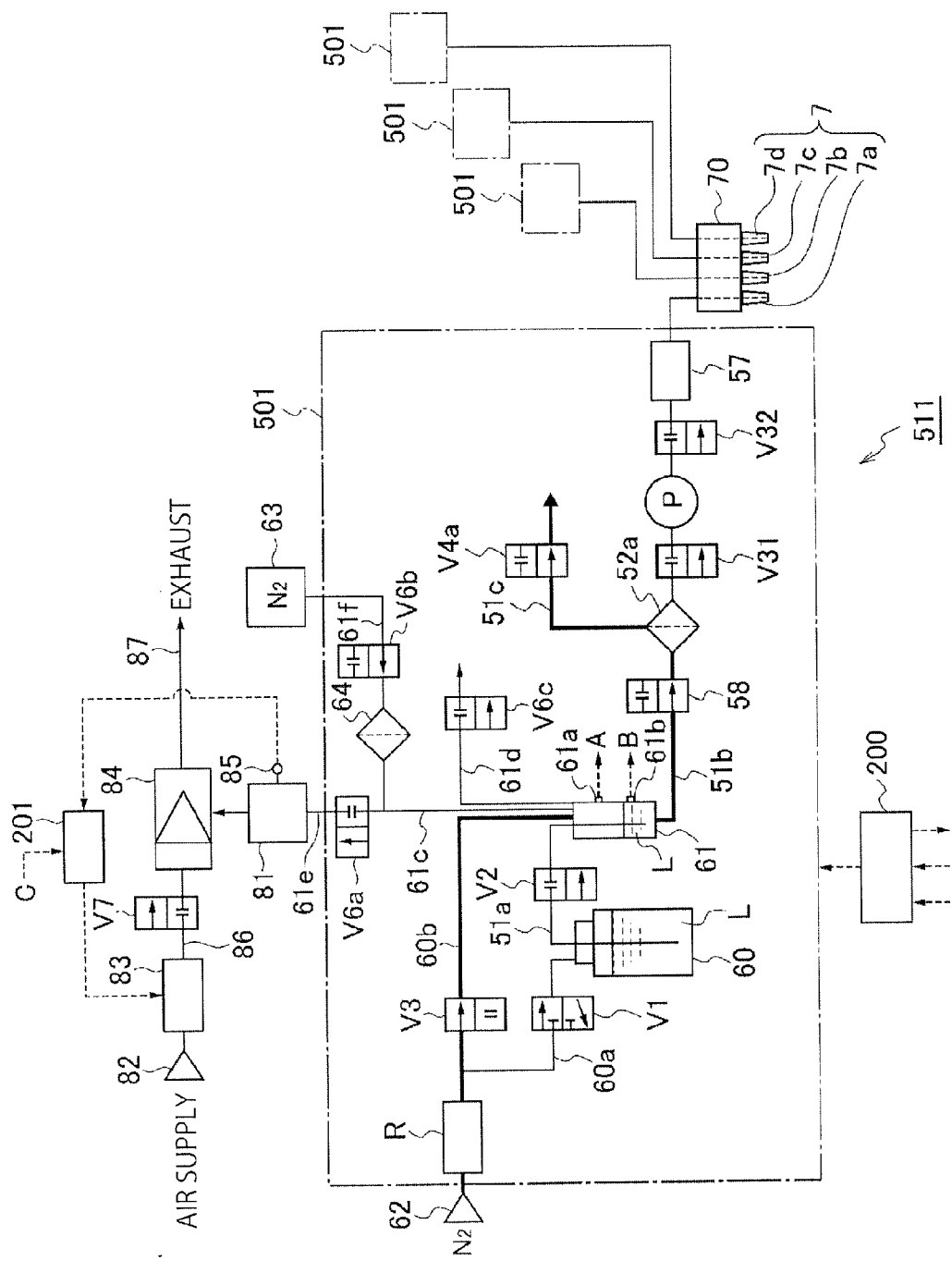
FIG. 8 is a second operation diagram of the processing liquid supplying apparatus.

After the aforementioned fluid line has been filled with the resist liquid L, venting of the filter 52a for removing gases remaining in the filter 52a is performed by opening the vent pipe 51c of the filter 52a, as shown in FIG. 8. As mentioned above, the operation for filling the aforementioned fluid line with the resist liquid L has been already completed. Thus, $N_2$ gas is supplied to the reservoir tank 61 from the second gas supplying pipe 60b bypassing the resist container 60, and the $N_2$ gas pressure for transporting the resist liquid L can thus be reduced. Accordingly, the filter 52a can be vented using $N_2$ gas of a lower pressure, so that dissolving of the gas into the resist liquid L can be suppressed. Incidentally, venting of the filter 52a can be performed while supplying the gas into the resist container 60, if such an operation will not lead to the situation where the dissolving of the gas into the resist liquid L is problematic.

After the preparation of the supplying of the resist liquid L has been completed, the switching valves V4a and V3 of the vent pipe 51c and the second gas supplying pipe 60b are closed. Then, a coating process of the resist liquid L to a wafer W is performed by the coating unit 24 (START in FIG. 5).

When the coating process is performed, the level of the resist liquid L in the reservoir tank 61 lowers, as the number of processed wafers W increases. When the low level sensor 61b is in "ON" state, the overall control unit 200 judges that a sufficient amount of the resist liquid L for processing a next wafer W is stored in the reservoir tank 61, and does not perform the replenishing operation of the resist liquid L (NO, in Step S101 of FIG. 5).

Figure 9:
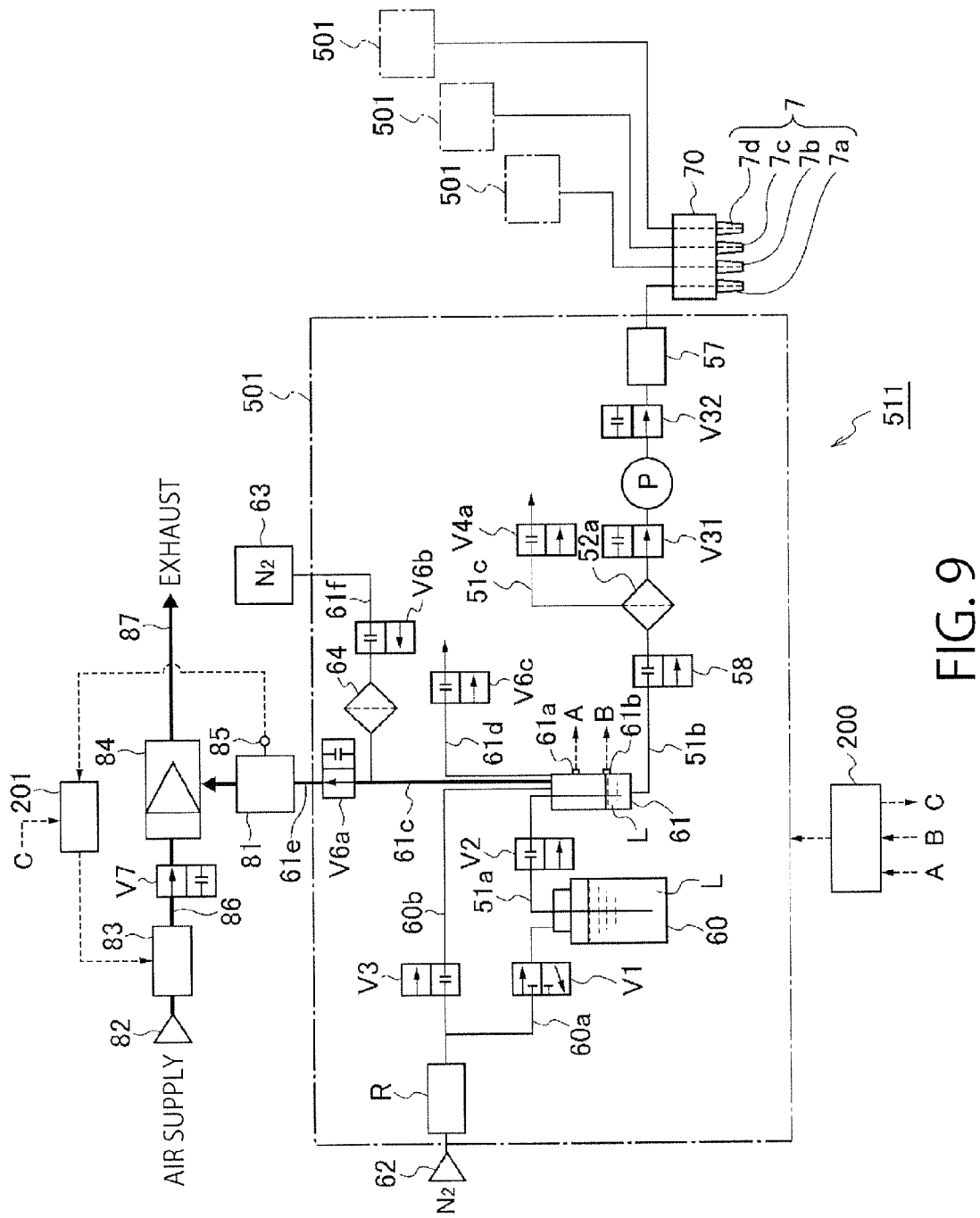
FIG. 9 is a third operation diagram of the processing liquid supplying apparatus.

As shown in FIG. 6(a), when the low level sensor 61b is turned into the "OFF" state at time point T1 after further processing of the wafers W (YES, in Step S101 in FIG. 5), the overall control unit 200 closes the switching valve 58 of the second processing liquid supplying pipe 51b as shown in FIG. 9, so that the resist liquid L cannot flow out of the reservoir tank 61. In addition, the overall control unit 200 activates the ejector 84 and opens the switching valve V6a of the tank exhaust pipe 61e to start evacuation of the reservoir tank 61 (Step S102 in FIG. 5, FIG. 6(d), FIG. 6(f)). At this time, the pressure-adjusting-gas supplying pipe 61f is closed (FIG. 6(e)).

At this time, the opening degree of the electro-pneumatic regulator 83, which is controlled by the controller 201, is controlled (in the illustrated embodiment in FIG. 6(b), 25%) such that the pressure in the trap tank 81 becomes a predetermined target pressure. The target pressure in the trap tank 81 is set such that a reduced pressure is established in the reservoir tank 61 under which the resist liquid L can be suctioned from the resist container 60 to flow into the reservoir tank 61 at a predetermined flow rate. In this embodiment, the target pressure in the trap tank 81 may be set such that gauge pressure (i.e., an amount of pressure reduction or a pressure difference ΔP1 from the atmospheric pressure) of −50 kPa (about −0.5 Pa) is established in the reservoir tank 61. The change of opening degree of the electro-pneumatic regulator 83 with time and the change of the pressure in the trap tank 81 with time respectively shown in (g) and (h) of FIG. 6 are ideal ones; delays or fluctuations may occur in practical operations.

Figure 10:
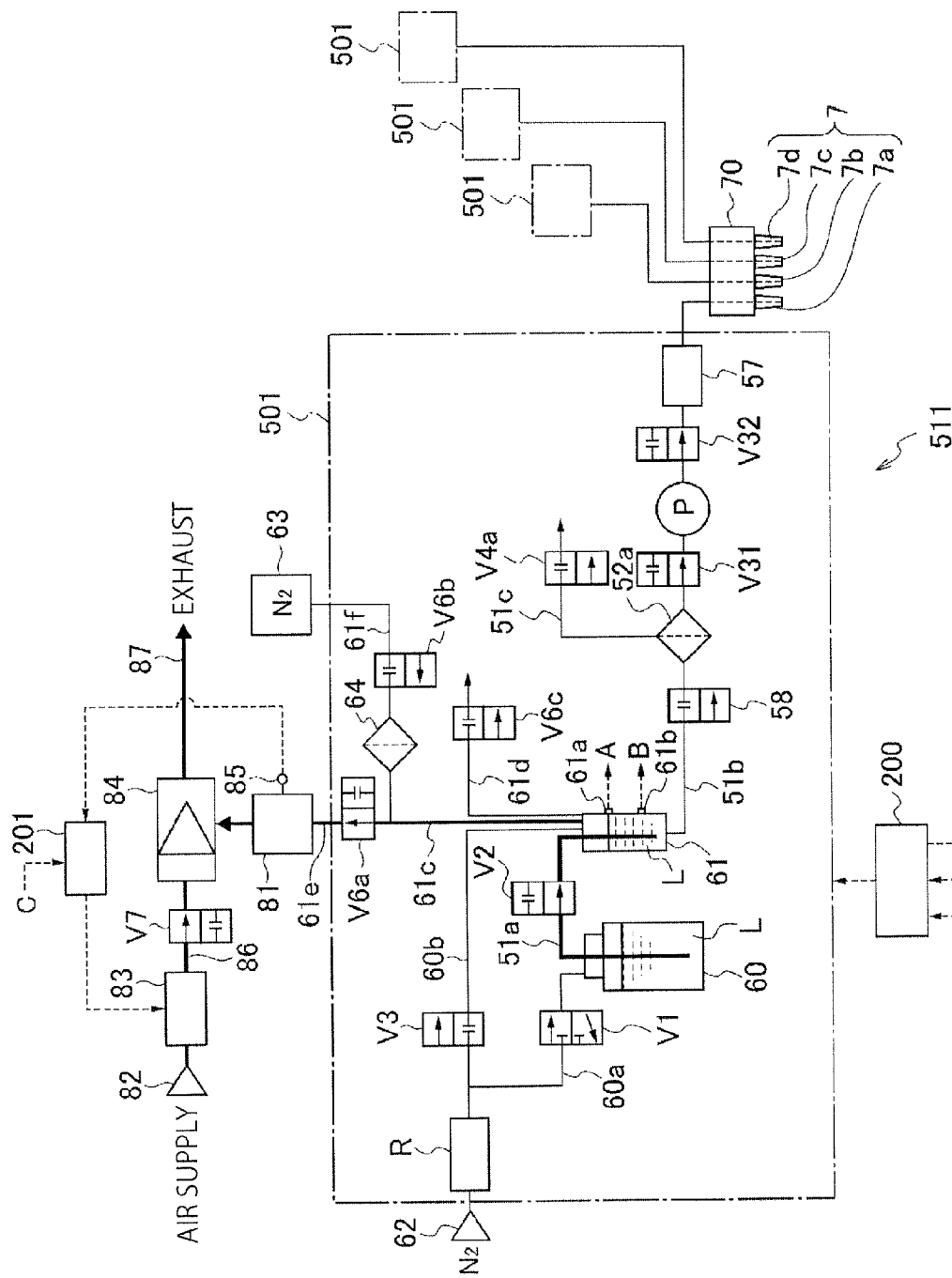
FIG. 10 is a fourth operation diagram of the processing liquid supplying apparatus.

When the evacuation of the reservoir tank 61 is continued under the condition shown in FIG. 9, the indication of the manometer 85 of the trap tank 81 gradually decreases, as shown in FIG. 6(h). Then, the indication value of the manometer 85 reaches the target pressure and the pressure becomes stable at time point T2, the switching valve V2 of the first processing liquid supplying pipe 51a is opened, so that the resist liquid L in the resist container 60 is suctioned and transported toward the reservoir tank 61 as shown in FIG. 10 (Step S103 in FIG. 5). At this time, the evacuation of the reservoir tank 61 by the ejector 84 is continued in order that the pressure in the trap tank 81 is maintained at the target pressure, so that the resist liquid L in the resist container 60 is transported toward the reservoir tank 61 at a constant flow rate.

Since the resist liquid L is transported by suctioning under a reduced pressure, dissolving of the gas into the resist liquid L can be restrained, as compared with a case where the resist liquid L is transported by pressurization with the use of $N_2$ gas. In addition, since the interior of the reservoir tank 61 is maintained at a reduced pressure, the gas having been dissolved in the resist liquid L during the preparative process steps shown in FIGS. 7 and 8 is released from the resist liquid L in the reservoir tank 61 to be discharged toward the ejector 84.

After that, when the liquid level of the resist liquid L in the reservoir tank 61 raises to reach the level of the low level sensor 61b at time point T3 the low level sensor 61b is turned into "ON" state as shown in FIG. 6(a). The overall control unit 200 continuously monitors the liquid level to confirm whether the liquid level reaches the level of the high level sensor 61a so that the high level sensor 61a is turned into "ON" state (Step S104 in FIG. 5). If the high level sensor 61a is still in "OFF" state, the overall control unit 200 continues the transport of the resist liquid L into the reservoir tank 61 (NO, in Step S104 in FIG. 5).

Then, as shown in FIG. 6(b), when the high level sensor 61a is turned into "ON" state at time point T4 (YES, in Step S104 in FIG. 5), the ejector 84 is stopped, and the switching valves V2 and V6a of the first processing liquid supplying pipe 51a and the tank exhaust pipe 61e are closed, so that the evacuation of the reservoir tank 61 and the transport of the resist liquid L is finished (Step 105 in FIG. 5, FIG. 6(c), FIG. 6(d) and FIG. 6(f)).

Figure 5:
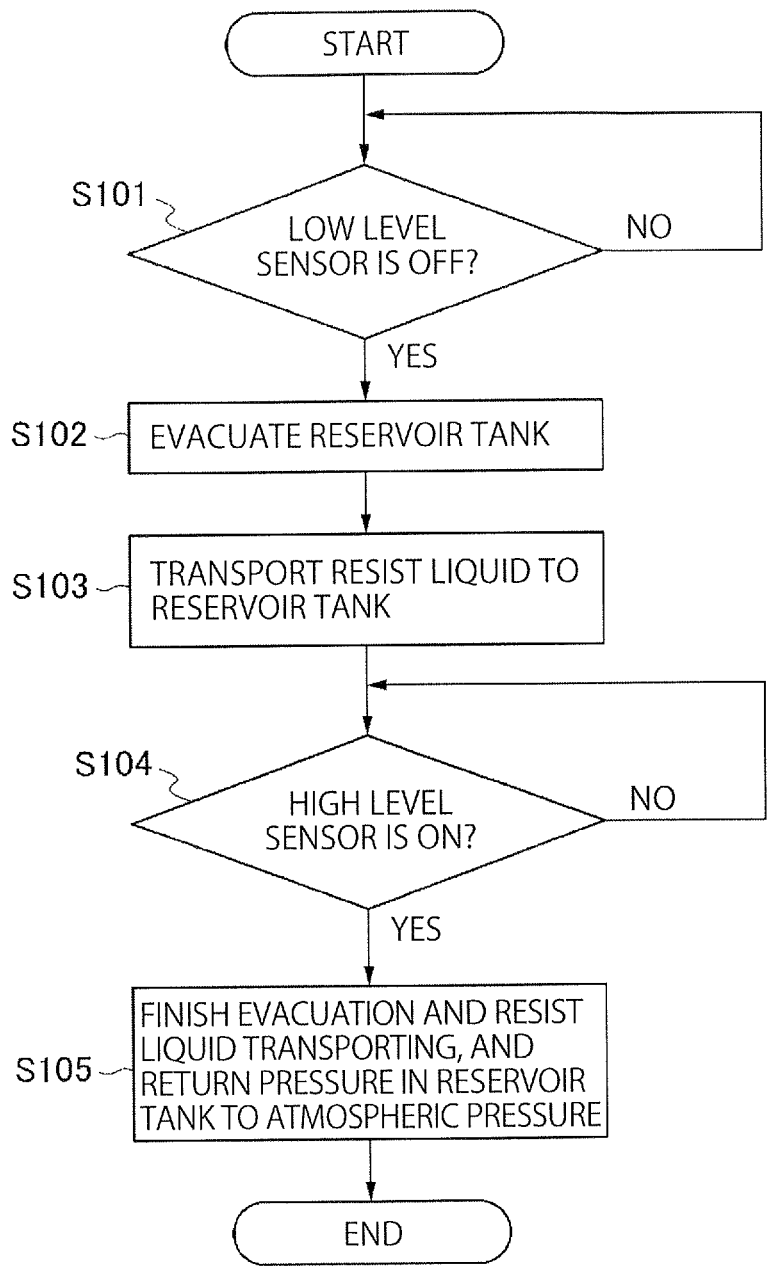
FIG. 5 is a flowchart showing a flow of the operation for replenishing a chemical liquid to a reservoir tank of the processing liquid supplying apparatus.
Figure 6:
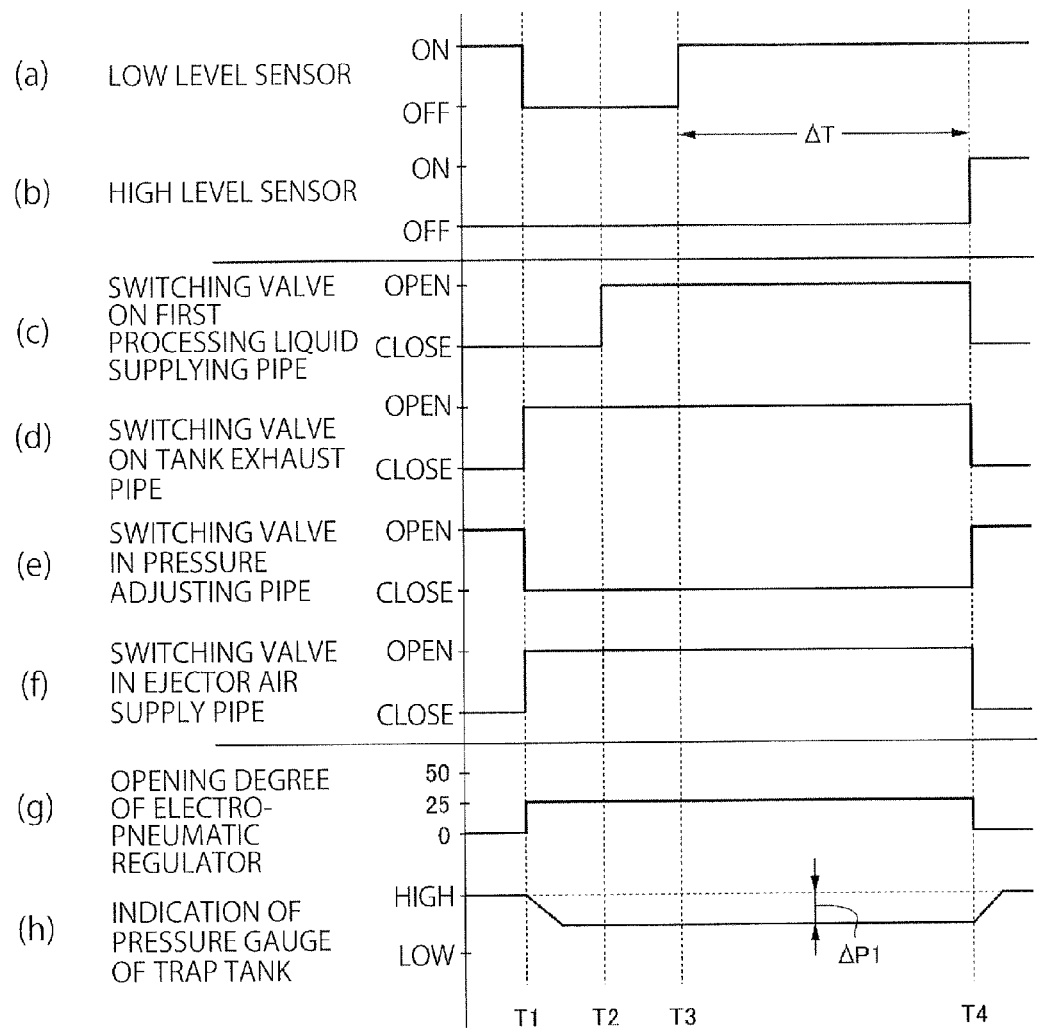
FIG. 6 is a time chart for explaining the operation for replenishing a chemical liquid to the reservoir tank.
Figure 11:
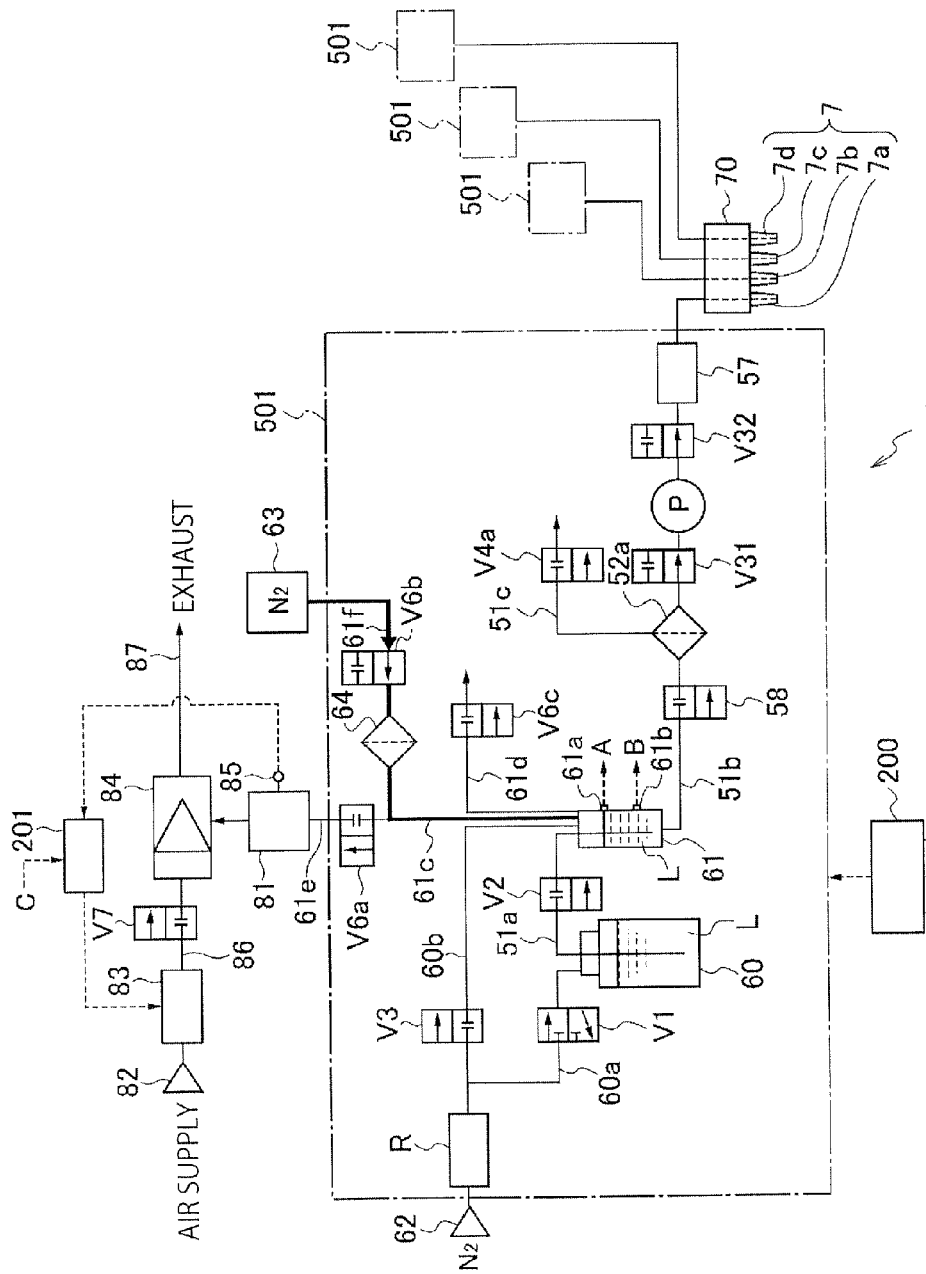
FIG. 11 is a fifth operation diagram of the processing liquid supplying apparatus.

Simultaneously with this operation, the switching valve V6b of the pressure-adjusting-gas supplying pipe 61f is opened to supply pressure-adjusting $N_2$ gas from the pressure-adjusting-gas supplying unit 63 to the reservoir tank 61, so that the pressure in the reservoir tank 61 is returned from the reduced pressure to the atmospheric pressure (Step S105 in FIG. 5, FIG. 6(e) and FIG. 11). Since the pressure-adjusting-gas supplying pipe 61f is provided thereon with the filter 64, particles contained in the pressure-adjusting $N_2$ gas can be removed, so that the resist liquid L to be supplied to a wafer W can be kept clean. In addition, since an inert gas ($N_2$ gas) is used for pressure adjusting, the supply of the resist liquid L to the nozzle 7a can be restarted without deterioration of the resist liquid L (END in FIG. 5).

Figure 12:
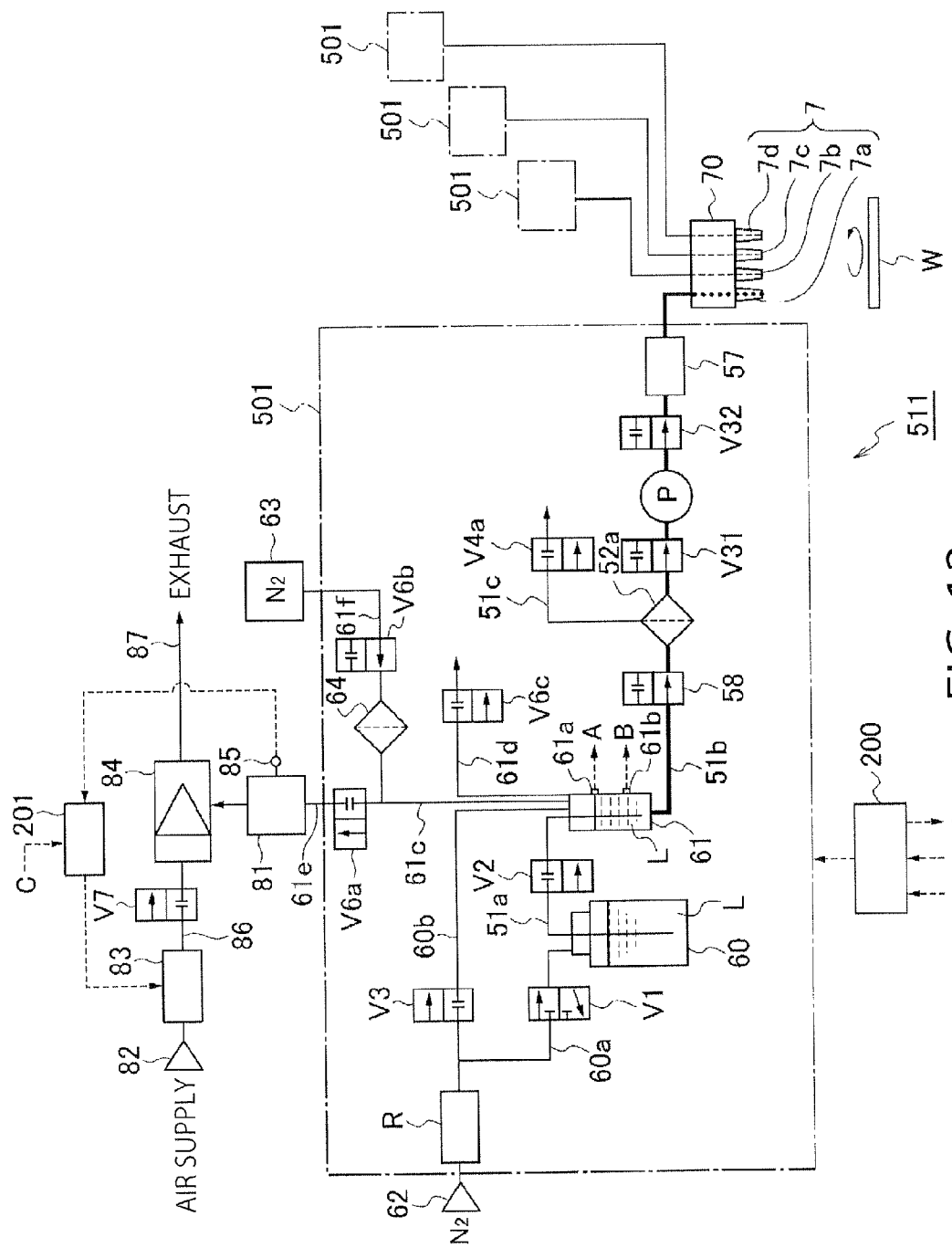
FIG. 12 is a sixth operation diagram of the processing liquid supplying apparatus.

When the replenishment of the resist liquid L to the reservoir tank 61 is finished, the switching valve 58 of the second processing liquid supplying pipe 51b is opened to place the nozzle 7a in communication with the reservoir tank 61 via the second processing liquid supplying pipe 51b, as shown in FIG. 12. After a wafer W has been loaded in to the coating unit 24 (COT in FIG. 24), the nozzle 7a is located above the wafer W rotating about a vertical axis. Then, the coating process is performed by supplying the resist liquid L from the nozzle 7a to the rotating wafer W (FIG. 12).

For simplicity of the explanation, the above explanation of the operation is made, with reference to FIGS. 5 to 12, for a case where a single reservoir tank 61 is connected to a single trap tank 81 and a single ejector 84. However, as previously described, the processing liquid supplying apparatus 511 has a plurality of reservoir tanks 61 (of the subsystems 502a to 502c) which are connected to the common (single) ejector 84 as shown in FIG. 4. The levels of the resist liquid L stored in the respective reservoir tanks 61 lower independently of each other, depending on the statuses of the wafer processing in the respective coating units 24. Thus, the replenishment of the resist liquid L to each of the reservoir tanks 61 is performed on demand. Therefore, the number of reservoir tanks 61, which are connected to (in fluid communication with) the ejector 84 through the trap tank 81 (which functions as a flow-combining unit) varies with time.

In such a case, if a target pressure in the trap tank 81, which has been set for the case where the resist liquid L is replenished to only one reservoir tank 61, is maintained even though the resist liquid L must be additionally replenished to another reservoir tank 61, the suctioning force is divided into two reservoir tanks 61 so that the flow rate of the resist liquid L flowing into each reservoir tanks 61 decreases. In order to avoid such a situation, the overall control unit 200 in this embodiment has a function of determining (varying) the target pressure in the trap tank 81 as a function of the number of the reservoir tanks 61 connected to (in communication with) the ejector 84, so that the evacuating rate by the ejector 84 is changed (controlled) so as to maintain the flow rate at which the resist liquid L is transported from the resist container 60 to each of the reservoir tank 61 is kept constant.

Figure 13:
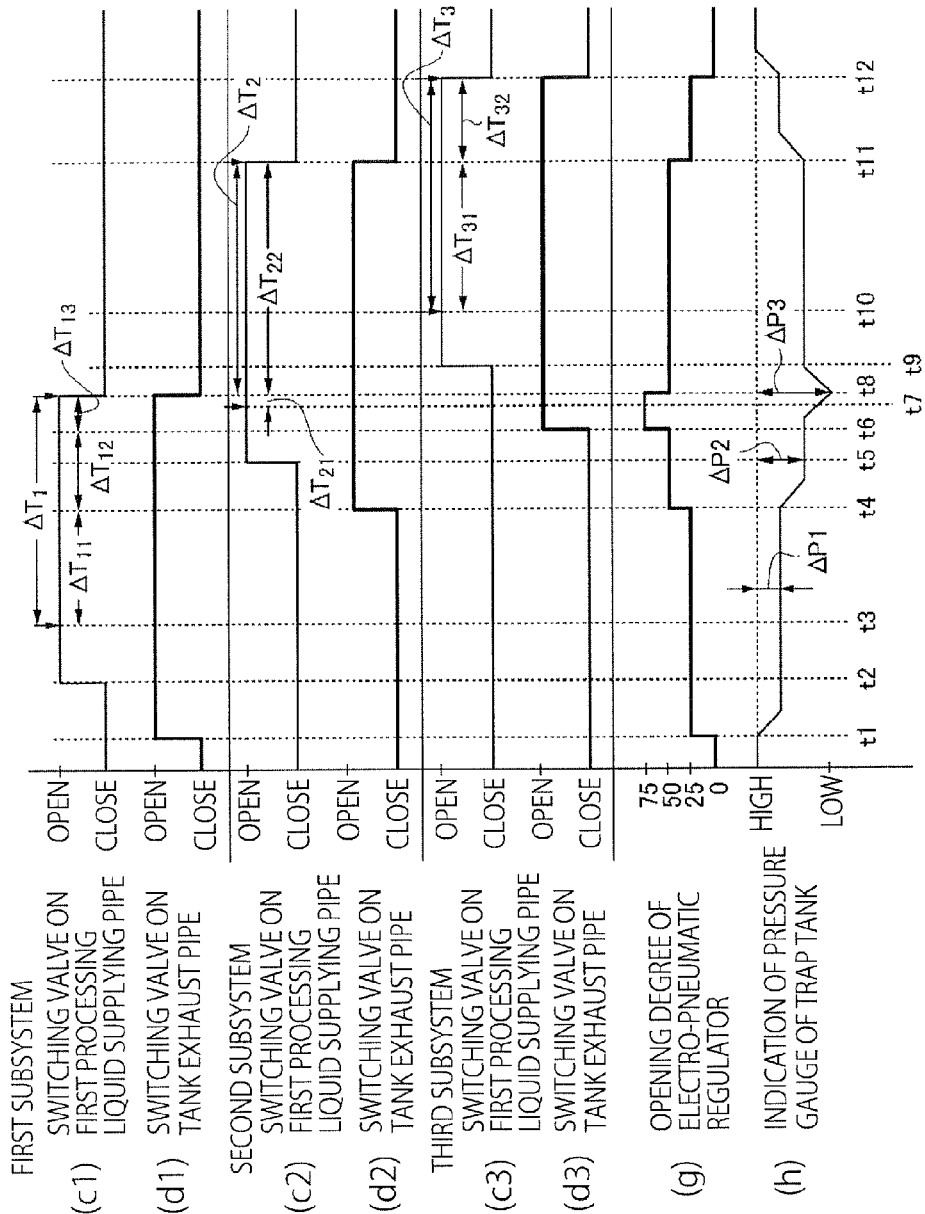
FIG. 13 is a time chart for explaining the operation for replenishing a chemical liquid to a plurality of reservoir tanks.

The function for evacuating the reservoir tanks 61 while varying the target pressure in the trap tank 81 is explained in detail below with reference to FIGS. 13 and 14. The time chart of (c1) and (c3) in FIG. 13 shows the status (open/close) of the switching valves V2 on the first processing liquid supplying pipes 51a in the subsystems 502a to 502c, respectively. The time chart of (d1) and (d3) in FIG. 13 shows the status (open/close) of the switching valves V6a on the tank exhaust pipes 61e in the subsystems 502a to 502c, respectively. The time chart of (g) and (h) of FIG. 13 show the opening degree of the electro-pneumatic regulator 83 and the indication of the manometer 85 disposed on the trap tank 81, respectively.

Figure 14:
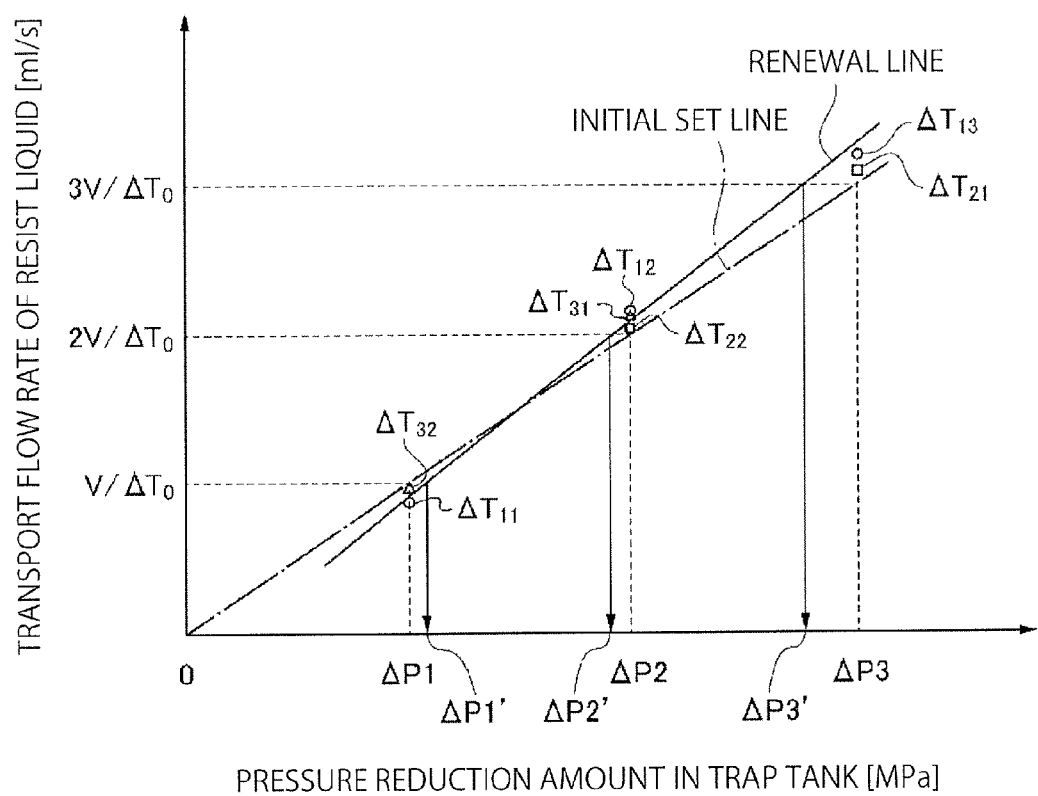
FIG. 14 is graph showing the relationship between an opening degree of an electro-pneumatic regulator provided on the processing liquid supplying apparatus and a flow rate of a chemical liquid.

FIG. 14 shows the relationship between the amount of pressure reduction (hereinafter referred to as "pressure reduction amount") in the trap tank 81 ($\Delta P$="atmospheric pressure"−"trap tank internal pressure") and the flow rate at which the resist liquid L is transported to the reservoir tank 61. Herein, it is assumed that in each of the subsystems 502a to 502c, the reservoir tanks 61 have the same shape, and the levels at which the high level sensor 61a and the low level sensor 61b are located are the same. In this case, in each of the subsystems 502a to 502c, equal amount "V" of the resist liquid L transported during the time period from the time point when the low level sensor 61b is turned into "ON" state (time point T3 in FIG. 6(a)) to the time point when the high level sensor 61a is turned into "ON". Thus, if the time period $\Delta T$ between time points T3 and T4 in FIG. 6 can be adjusted to a predetermined target time period $\Delta T0$, the resist liquid L can be transported at equal flow rate "$V/T_0$" in each of the subsystems 502a to 502c.

It is assumed that the pressure loss of the pipeline (and other parameters affecting the suctioning force) is adjusted such that equal suctioning force of the resist liquid L from the resist container 60 to each evacuated reservoir tank 61 is achieved. In this case, when two of the subsystems 502a to 502c are connected to the trap tank 81, the target pressure in the trap tank 81 is set such that the total flow rate (i.e., the sum of the flow rates) transported to the reservoir tanks 61 of the two subsystems 502a to 502c is twice ($2V/T_0$) as that when one of the subsystems 502a to 502c is connected to the trap tank 81; when three of the subsystems 502a to 502c are connected to the trap tank 81, the target pressure in the trap tank 81 is set such that the total flow rate transported to the reservoir tanks 61 of the two subsystems 502a to 502c is twice ($3V/T_0$) as that when one of the subsystems 502a to 502c is connected to the trap tank 81.

FIG. 14 is a graph showing an example of the relationship between the pressure reduction amount pressure ($\Delta P$ in FIG. 6(h); $\Delta P1$ to $\Delta P3$ in FIG. 13(h)) in the trap tank 81 and the target value of the transport flow rate of the resist liquid L, where the relationship can be expressed by a regression equation. Although a linear regression equation is used herein, another type of regression equation, such as an exponential regression equation, a polynomial regression equation, may be used.

The storage unit of the overall control unit 200 stores the regression equation of the initial set line shown in FIG. 14. In addition, the overall control unit 200 includes a timer (a time measurement unit) that measures, in each reservoir tank 61, the time period $\Delta T$ from the time point when the low level sensor 61b is turned into "ON" state to the time point when the high level sensor 61a thereof is turned into "ON" state. The high level sensor 61a, the low level sensor 61b and the timer constitute a flow-rate determining unit that determines the flow rate of the resist liquid L transported from the resist container 60 to the reservoir tank 61.

It is assumed that, in the three subsystems 502a to 502c of the processing liquid supplying apparatus 511 shown in FIG. 4, the low level sensor 61b is turned into "OFF" state and the evacuation of the reservoir tank 61 is started at time points t1, t4 and t6, respectively, as shown in (d1), (d2) and (d3) of FIG. 13. In (c1), (c2) and (c3) of FIG. 13, in the three subsystems 502a to 502c, the time periods from when the low level sensor 61b is turned into "ON" state to the time point when the high level sensor 61a is turned on into the "ON" state after the transport of the resist liquid L has been started, are shown by $\Delta T1$, $\Delta T2$ and $\Delta T3$, respectively.

The explanation is made for the operation for varying the target pressure in the trap tank 81 in order to keep constant the flow rate of the resist liquid L transported from the resist container 60 to each trap tank 61 in the processing liquid supplying apparatus 511 in which the three subsystems 502a to 502c are connected to and disconnected from the trap tank 81 on demand, with reference to the time chart of FIG. 13.

At time point t1, the low level sensor 61b of the first subsystem 501a is turned into "OFF" state, and the switching valve V6a of the tank exhaust pipe 61e is opened. At this time, based on the relationship indicated by the initial set line (chain-dotted lines) of FIG. 14, the overall control unit 200 gives the controller 201 a target pressure reduction amount in the trap tank 81 of $\Delta P1$. Then, the evacuation of the trap tank 81 by the ejector 84 is performed with the opening degree of the electro-pneumatic regulator 83 being 25%, for example. At time point t2 when the pressure in the trap tank 81 becomes stable, the overall control unit 200 opens the switching valve V2 of the first processing liquid supplying pipe 51a of the first subsystem 502a, so as to start the transport of the resist liquid L. Thereafter, at time point t3 when the low level sensor 61b of the reservoir tank 61 of the first subsystem 502a is turned into "ON" state, the measurement of time period by the timer is started.

While the transport of the resist liquid L is continued under the aforementioned condition, the low level sensor 61b of the reservoir tank 61 of the second subsystem 502b is turned into "OFF" state at time point t4, and the switching valve V6a of the tank exhaust pipe 61e of the second subsystem 502b is opened. At this time, in order that the resist liquid L can be transported to the reservoir tanks 61 of the two subsystems 502a and 502b at the total flow rate (the sum of the flow rates) of $2V/\Delta T0$, the overall control unit 200 gives the controller 201 the target pressure reduction amount in the trap tank 81 of $\Delta P2$, based on the initial set line of FIG. 14.

Assuming that the opening degree of the electro-pneumatic regulator 83 and the pressure reduction amount in the trap tank 81 are in a linear relationship, the evacuation of the trap tank 81 by the ejector 84 is started with the opening degree of the electro-pneumatic regulator 83 being doubled (i.e., 50%). Then, at time point t5 when the pressure in the trap tank 81 becomes stable, the transport of the resist liquid L to the reservoir tank 61 of the second subsystem 502b is started. At time point t7, the measurement of the time period, during which the resist liquid L is transported to the reservoir tank 61 of the second subsystem 502b, is started.

Further, at the time point t6, the low level sensor 61b of the reservoir tank 61 of the third subsystem 502c is turned into "OFF" state, and the switching valve V6a of the tank exhaust pipe 61e of the third subsystem 502c is opened. In order that the resist liquid L can be transported to the reservoir tanks 61 of the subsystems 502a to 502c at a total flow rate of $3V/\Delta T0$, the overall control unit 200 gives the controller 201 the target pressure reduction amount in the trap tank 81 of $\Delta P3$, based on the initial set line of FIG. 14.

Due to the change of the target pressure reduction amount in the trap tank 81, the opening degree of the electro-pneumatic regulator 83 is tripled (i.e., 75%), and the evacuation of the trap tank 81 by the ejector 84 is started under this condition. Then, at time point t9 when the pressure in the trap tank 81 becomes stable, the transport of the resist liquid L in the second subsystem 502b is stated. At time point t10, the measurement of the time period, during which the resist liquid L is transported to the reservoir tank 61 of the third subsystem 502c, is started.

In the example shown in FIG. 13, at time point t8, the replenishment of the resist liquid L to the reservoir tank 61 of the first subsystem 502a is finished, and the switching valves V2 and V6a of the first processing liquid supplying pipe 51a and the tank exhaust pipe 61e are closed ((c1) and (d1) FIG. 13). Although it is not shown in FIG. 13, the switching valve V6b of the pressure-adjusting-gas supplying pipe 61f is opened simultaneously with the above operation, so that pressure-adjusting $N_2$ gas is supplied to the reservoir tank 61 whereby the pressure in the reservoir tank 61 is returned to the atmospheric pressure, like the operation at the time point T4 in FIG. 6(e) (the same operation is performed upon completion of the replenishment of the resist liquid L in each of the second and third subsystems 502b and 502c).

After the evacuation of the reservoir tank 61 of the first subsystem 502 has been finished, the number of the reservoir tanks 61 to be evacuated by the ejector 84 is two. Namely, the reservoir tanks 61 of the second and third subsystems 502b and 502c are evacuated. Thus, at time point t8, the overall control unit 200 gives the controller 201 a target pressure reduction amount in the trap tank 81 of $\Delta P2$, and regulates the sum of flow rates of the resist liquid L transported to the reservoir tanks 61 of the subsystems 502b and 502c at "$2V/\Delta T0$".

Returning to FIG. 13, at time point t11, the replenishment of the resist liquid L to the reservoir tank 61 of the second subsystem 502b is finished. Then, the overall control unit 200 closes the switching valve V2 and V6a of the first processing liquid supply pipe 51a and the tank exhaust pipe 61e ((c2) and (d2) of FIG. 13), and sets the target pressure reduction amount in the trap tank 81 such that a flow rate at which the reis liquid L is transported in the third subsystem 502c becomes "V/ΔT0" (FIG. 13(g)).

Then, at the time point t12, the replenishment of the resist liquid L of the third subsystem 502c is finished. Then, the overall control unit 200 closes the switching valves V2 and V6a of the first processing liquid supply pipe 51a and the tank exhaust pipe 61e ((c2) and (d2) of FIG. 13), and shut-off the electro-pneumatic regulator 83 to finish the evacuation by the ejector 84 (FIG. 13(g)). Thus, the switching valve V7 of the feed line 86, whose operation is not shown in FIG. 13, is opened from time point t1 to time point t12.

As described above, by varying the target pressure reduction amount in the trap tank 81 as a function of the number of the reservoir tanks 61 connected to (in communication with) the ejector 84 through the trap tank 81, the resist liquid L can be transported at substantially the same flow rate to each of the reservoir tanks 61.

During the above operation, the overall control unit 200 acquires the time period ΔT1 required for transporting the amount "V" of the resist liquid L, based on the time period, measured by the timer, during which the resist liquid L is transported to the reservoir tank 61 of the first subsystem 502a. Based on time period ΔT11 during which the resist liquid L is transported to the reservoir tank 61 of one (502a) of the subsystems from time point t3 to time point t4, based on time period ΔT12 during which the resist liquid L is transported to the reservoir tanks 61 of two (502a and 502b) of the subsystems from time point t4 to time point t6, and based on time period ΔT13 in which the resist liquid L is transported to the reservoir tanks 61 of three (502a to 502c) of the subsystems from time point t6 to time point t8, the average flow rate of the resist liquid L transported to the reservoir tank 61 of the first subsystem 502a in each time period can be calculated.

For example, the average flow rate during the time period from time point t3 to time point t4 during which the resist liquid L is transported to one reservoir tank 61 of the subsystem 502 can be expressed by "(V/ΔT1)·(ΔT11/ΔT1)"; the average flow rate during the time period from time point t4 to time point t6 in which the resist liquid L is transported to two reservoir tanks 61 of the subsystems 502a and 502b can be expressed by "(2V/ΔT1)·(ΔT12/ΔT1)"; the average flow rate during the time period from time point t6 to time point t8 in which the resist liquid L is transported to three reservoir tanks 61 of the subsystems 502a to 502c can be expressed by "(3V/ΔT1)·(ΔT13/ΔT1)"

In FIG. 14, the values of the average transport flow rates calculated according to the above method are plotted by white circles labeled ΔT11, ΔT12 and ΔT13. The overall control unit 200 stores the average transport flow rate values in the storage unit.

In addition, the average transport flow rate of the resist liquid L to the reservoir tank 61 of each of the second and third subsystems 502b and 502c in each of the time periods can be calculated in the same way, based on the measurement results by the timer. In FIG. 14, the values of the average transport flow rates related to the second subsystems 502b are plotted by white squares labeled ΔT21 and ΔT22; the values of the average transport flow rates related to the third subsystems 502c are plotted by white triangles labeled ΔT31 and ΔT32. The overall control unit 200 stores these values in the storage unit.

If the difference of the value (i.e., actual value) of the transport flow rate of the resist liquid L calculated by the above method, from the flow rate (V/ΔT0, 2V/ΔT0, 3V/ΔT0) used in the regression equation indicated by "initial set line (chain-dotted lines)" shown in FIG. 14) based on which the target pressure in the trap tank 81 has been set, is out of the allowable range, the overall control unit 200 renews the regression equation. To be specific, the overall control unit 200 generates a new regression equation indicated by "renewed line (solid line)" shown in FIG. 14, based on the pressure detection result of the manometer 85 and the values (actual values) of the transport flow rates of the resist liquid L. Thereafter, the overall control unit 200 sets the target pressure based on the renewed regression equation (ΔP1', ΔP2", ΔP3'). In the above explanation, the regression equation is renewed based on the data obtained during the operation in which the resist liquid L is transported to the reservoir tanks 61 of the sub-sections 502a to 502c each only once. However, the regression equation may be renewed based on the data (actual values) the transport flow rate obtained during the operation in which the resist liquid L is transported to the reservoir tanks 61 of the sub-sections 502a to 502c each plural times, so that the regression equation can be renewed more precisely.

The forgoing processing liquid supplying apparatus 511 is advantageous in the following respects.

Since the resist liquid L is transported from the resist container 60 to the reservoir tank 61 by evacuating the interior of the reservoir tank 61, dissolving of a gas into the resist liquid L during the transportation of the resist liquid L can be restrained, whereby generation of bubbles in the resist liquid L can be prevented.

In addition, since the resist liquid L is supplied to a wafer W through the reservoir tank 61, a wafer W can be processed even under the situation where the resist liquid L cannot be fed from the resist container 60, e.g., during the replacement of the resist container 60 or the like.

In the above embodiment, by pressure-adjusting $N_2$ gas supplied from the pressure-adjusting-gas supplying unit 63, the pressure in the reservoir tank 61 is returned from a reduced pressure (first reduced pressure) to the atmospheric pressure (i.e., a normal pressure). However, not limited thereto, the gas pressure in the reservoir tank 61 to be returned from the reduced pressure (first reduced pressure) may be a second reduced pressure higher than the first pressure (e.g., a slightly reduced pressure), as long as the feed pump P can feed the processing liquid to the nozzle 7, for example. The term "normal pressure" herein means not only the atmospheric pressure but also the aforementioned second reduced pressure.

Further, the feed pump P disposed on the second processing liquid supplying pipe 51b, which is located on the outlet side of the reservoir tank 61, may be omitted. In this case, for example, the reservoir tank 61 may be disposed at a level higher than the nozzle 7, so that the resist liquid L can be supplied by utilizing a potential energy of the resist liquid L.

In addition, although the evacuating unit comprises the ejector 84 in the foregoing embodiment, the interior of the reservoir tank 61 may be evacuated using a vacuum pump.

Moreover, a gas other than $N_2$ gas (e.g., air) may be used as the pressure-adjusting gas, as long as problematic deterioration of the processing liquid does not occur.

In the coating and developing apparatus, a processing unit, in which the processing liquid supplying apparatus 511 shown in FIGS. 3 and 4 is incorporated, is not limited to a resist coating unit. The processing liquid supplying apparatus 511 may be incorporated into the above-described anti-reflection film coating unit (BCT) 23 to supply a material liquid of an antireflection film, or into the above-described developing unit (DEV) 25b to supply a developer, or into a protective film forming unit (ITC) to supply a material liquid of a protective film to be formed on a resist film.

Furthermore, not limited to the liquid processing unit of a coating and developing apparatus, the processing liquid supplying apparatus 511 may be incorporated into a liquid processing apparatus that to supply an acid cleaning liquid or an alkali cleaning liquid to a wafer to perform a cleaning process.

A process object to which a processing liquid is supplied by the processing liquid supplying apparatus 511 is not limited to a semiconductor wafer but may be a substrate of another type such as a glass substrate for FPD (Flat Panel Display).

What is claimed is:

1. A processing liquid supplying apparatus that supplies a processing liquid to a process object via a discharging part, said apparatus comprising:
   a processing liquid source that supplies a processing liquid;
   an intermediate tank connected to the processing liquid source via a transport line;
   a feed line provided between the intermediate tank and the discharging part;
   an evacuating unit that evacuates an interior of the intermediate tank to transport the processing liquid from the processing liquid source to the intermediate tank through the transport line;
   a pressure adjusting unit that supplies a gas into the intermediate tank to return a pressure in the evacuated intermediate tank from a reduced pressure to a normal pressure, thereby to place the intermediate tank ready for feeding the processing liquid, having been transported into the intermediate tank, into the feed line, wherein a plurality of intermediate tanks are connected to the processing liquid source in parallel,
   said processing liquid supplying apparatus further comprising:
   a flow-combining unit, disposed between the plurality of intermediate tanks and the evacuating unit, in which gases evacuated from the intermediate tanks merge with each other;
   a pressure sensor that detects a pressure in the flow-combining unit; and
   a control unit configured to perform a step of setting a target pressure in the flow-combining unit as a function of the number of the intermediate tanks to which the processing liquid is transported, the target pressure causing the processing liquid to flow from the processing liquid source to each of the intermediate tanks at a predetermined flow rate, and a step of controlling an evacuating rate of the evacuating unit such that the pressure in the flow-combining unit detected by the pressure sensor becomes a predetermined target pressure.

2. The processing liquid supplying apparatus according to claim 1, wherein the processing liquid source includes a pressurizing unit that pressurizes the processing liquid in the processing liquid source, thereby to fill the feed line with the processing liquid through the transport line and the intermediate tank through the transport line and the intermediate tank.

3. The processing liquid supplying apparatus according to claim 1, further comprising a flow rate-determining unit that determines a flow rate of the processing liquid transported from the processing liquid source to each of the intermediate tanks,
wherein the control unit is configured to perform the setting of the target pressure using a regression equation expressing a relationship between the pressure in the flow-combining unit and a sum of flow rates of the processing liquid transported from the processing liquid source to the respective intermediate tanks, and configured, if a difference between the sum of the flow rates of the processing liquid determined by the flow rate-determining unit and the sum of flow rates calculated by applying the target pressure to the regression equation is out of a predetermined allowable range when the processing liquid is transported to the respective intermediate tanks with the pressure in the flow-combining unit being set at the target pressure, to generate a new regression equation based on an actual value of the pressure in the flow-combining unit detected by the pressure sensor and actual values of the flow rates determined by the flow rate-determining unit, and configured to set the target value using the new regression equation.

4. The processing liquid supplying apparatus according to claim 3, wherein the flow rate-determining unit includes a lower liquid level sensor and a higher liquid level sensor disposed at different height levels of each of the intermediate tanks, a time measurement unit that measures a time period from a time point when the liquid level is detected by the lower liquid level sensor to a time point when the liquid level is detected by the higher liquid level sensor, and wherein the flow rate-determining unit is configured to determine the flow rate of the processing liquid based on a volume of a part of the intermediate tank between the lower and higher liquid level sensors and a time period measured by the time measurement unit.

5. The processing liquid supplying apparatus according to claim 1, wherein the gas supplied from the pressure adjusting unit into the intermediate tank is an inert gas.

6. The processing liquid supplying apparatus according to claim 1, wherein the pressure adjusting unit has a filter for removing particles from the gas supplied to the intermediate tank.

7. A processing liquid supplying method for supplying a processing liquid to a process object via a discharging part, said method comprising:
   evacuating an interior of an intermediate tank which is connected to a processing liquid source that supplies the processing liquid via a transport line, thereby transporting the processing liquid to the intermediate tank;
   supplying a gas for adjusting a pressure into the intermediate tank, having been evacuated, to return pressure in the intermediate tank from a reduced pressure to a normal pressure;
   feeding the processing liquid, having been supplied into the intermediate tank, into a feed line provided between the intermediate tank and the discharging part, wherein a plurality of intermediate tanks are connected to the processing liquid source in parallel, and a flow-combining unit is disposed between the plurality of intermediate tanks and an evacuating unit so that exhaust gases discharged from the intermediate tanks merge with each other in the flow-combining unit,
   said method further comprising:
   measuring pressure in the flow-combining unit;
   setting a target pressure in the flow-combining unit, as a function of the number of the intermediate tanks to which the processing liquid is transported, the target pressure causing the processing liquid to flow from the processing liquid source to each of the inteimediate tanks at a predetermined flow rate; and controlling an evacuating rate of the evacuating unit such that the pressure in the flow-combining unit is regulated at a predetermined target pressure.

8. The processing liquid supplying method according to claim 7, further comprising:

before evacuating the interior of the intermediate tank for transporting the processing liquid to the intermediate tank, pressuring the processing liquid in the processing liquid source, thereby filling the feed line with the processing liquid through the transport line and the intermediate tank.

9. The processing liquid supplying method according to claim 7, further comprising:

determining a flow rate of the processing liquid transported from the processing liquid source to each of the intermediate tanks;

performing the setting of the target pressure using a regression equation expressing a relationship between the pressure in the flow-combining unit and a sum of flow rates of the processing liquid transported from the processing liquid source to the respective intermediate tanks;

if a difference between a sum of the flow rates determined by the flow rate-determining unit and the sum of flow rates calculated by applying the target pressure to the regression equation is out of a predetermined allowable range when the processing liquid is transported to the respective intermediate tanks with the pressure in the flow-combining unit being set at the target pressure, generating a new regression equation based on an actual value of the pressure in the flow-combining unit and actual values of the flow rates determined by the flow rate-determining unit; and setting the target value using the new regression equation.

10. The processing liquid supplying method according to claim 7, wherein the gas for adjusting the pressure is an inert gas.

11. The processing liquid supplying method according to claim 7, further comprising filtering the gas which is supplied to the intermediate tank for adjusting the pressure, thereby removing particles from the gas.

12. A non-transitory storage medium storing a computer program upon execution of which a processing liquid supplying apparatus performs the processing liquid supplying method according to claim 7.

* * * * *